United States Patent
Marutani et al.

(10) Patent No.: US 7,027,741 B2
(45) Date of Patent: Apr. 11, 2006

(54) PHASE LOCK LOOP CIRCUIT AND OPTICAL REPEATING APPARATUS, OPTICAL TERMINAL APPARATUS, AND OPTICAL COMMUNICATION SYSTEM HAVING THE SAME

(75) Inventors: Masazumi Marutani, Kawaski (JP); Takuji Yamamoto, Kawasaki (JP); Naoki Kuwata, Kawasaki (JP); Katsuya Yamashita, Hachioji (JP)

(73) Assignee: Fujitsu Limited, Kawasaki (JP)

( * ) Notice: Subject to any disclaimer, the term of this patent is extended or adjusted under 35 U.S.C. 154(b) by 258 days.

(21) Appl. No.: 10/128,672

(22) Filed: Apr. 23, 2002

(65) Prior Publication Data

US 2002/0121937 A1 Sep. 5, 2002

Related U.S. Application Data

(63) Continuation of application No. PCT/JP99/06803, filed on Dec. 3, 1999.

(30) Foreign Application Priority Data

Dec. 3, 1999 (JP) .................................. PCT/JP99/06803

(51) Int. Cl.
*H04B 10/02* (2006.01)

(52) U.S. Cl. .................. 398/173; 398/175; 398/176; 398/177; 398/202; 398/209; 398/154; 398/155; 375/376; 375/375; 327/156; 327/157; 331/1 R; 331/17; 331/25; 331/1 A

(58) Field of Classification Search ................. 398/173, 398/175, 176, 177, 202, 209, 154, 155; 375/376, 375/375, 316, 327, 340, 342, 374; 327/156, 327/157; 331/1 R, 17, 25, 1 A, 10, 11, 57, 331/16
See application file for complete search history.

(56) References Cited

U.S. PATENT DOCUMENTS

| 4,069,462 A | * | 1/1978 | Dunn ........................... 331/11 |
| 4,464,771 A | * | 8/1984 | Sorensen ..................... 375/120 |
| 4,510,461 A | | 4/1985 | Dickes et al. |
| 5,315,270 A | | 5/1994 | Leonowich |
| 5,378,937 A | | 1/1995 | Heidemann et al. |
| 5,963,110 A | | 10/1999 | Ihara et al. |
| 5,987,085 A | * | 11/1999 | Anderson .................... 375/374 |
| 6,064,236 A | | 5/2000 | Kuwata et al. |
| 6,072,370 A | * | 6/2000 | Nakamura .................... 331/25 |
| 6,337,886 B1 | * | 1/2002 | Asahi ........................ 375/316 |
| 6,498,670 B1 | * | 12/2002 | Yamashita et al. .......... 359/189 |

FOREIGN PATENT DOCUMENTS

| EP | 0 521 342 A2 | 1/1993 |
| EP | 0 585 095 A2 | 3/1994 |
| JP | 58-43632 | 3/1983 |
| JP | 64-11418 | 1/1989 |
| JP | 11-122066 | 4/1999 |
| JP | 11-122232 | 4/1999 |

OTHER PUBLICATIONS

Patent Abstracts of Japan of JP 05–206895 dated Aug. 13, 1993.
Patent Abstracts of Japan of JP 06–188727 dated Jul. 8, 1994.
* cited by examiner

*Primary Examiner*—Hanh Phan
(74) *Attorney, Agent, or Firm*—Staas & Halsey LLP

(57) ABSTRACT

According to a PLL circuit of the present invention, an output of a phase comparator is adjusted according to a space-to-mark transition-probability of an input signal so that an output of a voltage controlled oscillator has a predetermined frequency and phase. Therefore, even when a phase of a timing clock is set other than at 0, an output of the PLL circuit can be kept at the set phase, irrespective of the space-to-mark transition-probability. By using the PLL circuit as such in an optical communication apparatus and an optical communication system, a discrimination point can be kept almost fixed, and therefore, it is possible to lower an error rate.

61 Claims, 19 Drawing Sheets output of phase signal detecting circuit output of reference circuit output of reference circuit output of reference circuit

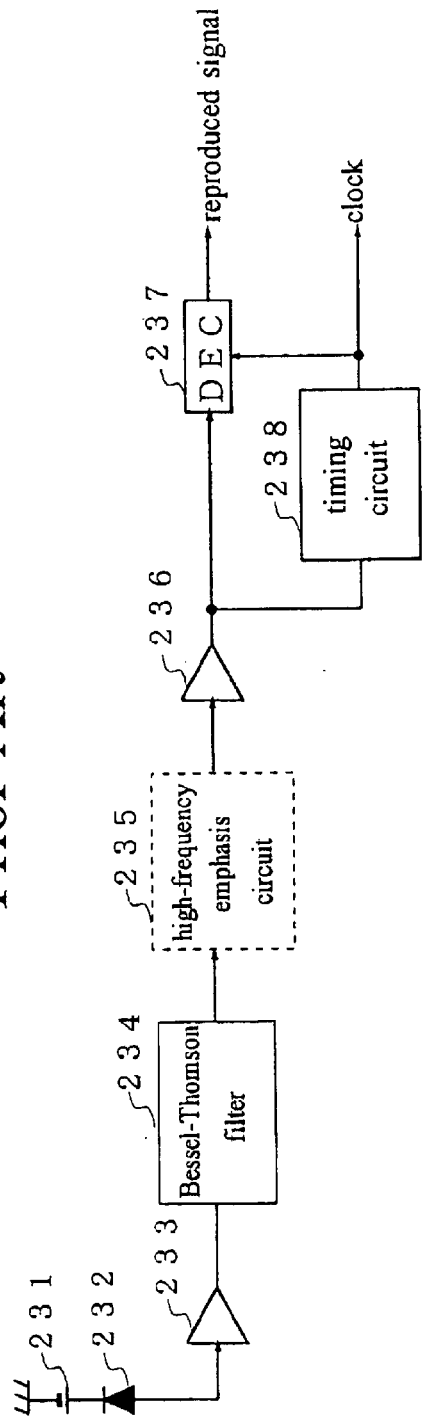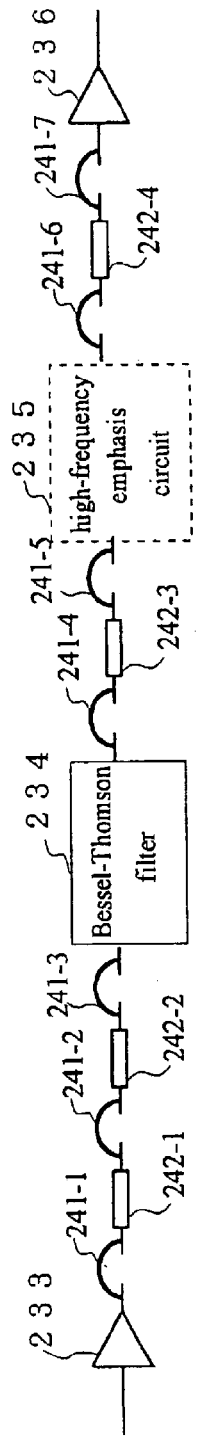
FIG.19(a) Prior Art
FIG.19(b) Prior Art

PHASE LOCK LOOP CIRCUIT AND OPTICAL REPEATING APPARATUS, OPTICAL TERMINAL APPARATUS, AND OPTICAL COMMUNICATION SYSTEM HAVING THE SAME

This application is a continuing application, filed under 35 U.S.C. §111(a), of International Application PCT/JP99/06803, filed Dec. 3, 1999.

BACKGROUND OF THE INVENTION

1. Field of the Invention

The present invention relates to a phase lock loop circuit which is used in an optical repeating apparatus, and more particularly, it is an object of the present invention to provide the phase lock loop circuit which can generate a timing clock being kept almost fixed even when a space-to-mark transition-probability of an input signal changes. Further, it is another object of the present invention to provide an optical repeating apparatus, an optical terminal apparatus, and an optical communication system which use the phase lock loop circuit as mentioned above.

2. Description of the Related Art

In optical repeating apparatuses and an optical terminal apparatus which constitute an optical communication system, it is necessary to establish bit synchronization in order to reproduce respective bits of digital signals. The bit synchronization is categorized into an external-timing method and a self-timing method. The external-timing method is the method of sending timing information through a transmission line which is different from that of a main signal. The self-timing method is the method of extracting timing information from a main signal in a timing circuit. This timing circuit can be structured by using a tank circuit and a limiter, and by using a phase lock loop (hereinafter abbreviated to "PLL") circuit.

An explanation about the structure of an optical receiving apparatus using the PLL circuit as the timing circuit will be given.

In FIG. 16, an optical signal transmitting through an optical transmission line is converted from the optical signal to an electric signal in a photoelectric conversion circuit (hereinafter abbreviated to "O/E") 201 in the optical receiving apparatus, and the received signal whose waveform is deteriorated is compensated in an equalizing amplifier circuit (hereinafter abbreviated to "EQL") 202. The deterioration of the waveform is caused due to transmission loss, wavelength dispersion, and a nonlinear optical effect of the optical transmission line. An output of the EQL 202 is supplied to a discrimination decision circuit (hereinafter abbreviated to "DEC") 203 for reproducing the received signal and the timing circuit.

The timing circuit is structured by including a phase comparator 204 and a voltage controlled oscillator (hereinafter abbreviated to "VCO", 205, and more specifically, it is structured by including a phase signal detecting circuit, a reference circuit, an amplifier, and the VCO 205.

The output of the EQL 202 is supplied to the phase signal detecting circuit and the reference circuit in the timing circuit. The phase signal detecting circuit outputs a voltage corresponding to a phase difference between the received signal and a timing clock. The reference circuit outputs a fixed voltage irrespective of the phase difference between them. This voltage value is set so that a discrimination point corresponds to the phase of the timing clock. Outputs of the phase signal detecting circuit and the reference circuit are outputted to the amplifier. The amplifier outputs a voltage based on a difference between the outputs to a control terminal of the VCO 205 for controlling its oscillation frequency. Hence, the VCO 205 oscillates so that the output of the phase signal detecting circuit corresponds to the output of the reference circuit, that is, the phase of the timing clock corresponds to the discrimination point. An output of the VCO 205 is supplied to the phase signal detecting circuit and the DEC 203.

Thus, the timing circuit generates the timing clock from the received signal. The DEC 203 discriminates whether the signal is "1" or "0" at the discrimination point given by the timing clock, thereby reproducing the received signal.

The structure of the timing circuit as such is shown in FIG. 17 in more detail.

In FIG. 17, the output of the EQL 202 is inputted to a D flip-flop circuit (hereinafter abbreviated to "D-FF") 211 and an exclusive OR circuit (hereinafter abbreviated to "EXOR") 212, respectively. Further, an output of the VCO 220 is inputted to a clock input of the D-FF 211.

An output of the D-FF 211 is inputted to the EXOR 212, an EXOR 216, and a delay circuit 215, respectively.

The delay circuit 215 delays the input by a half cycle and outputs it to the EXOR 216.

An output of the EXOR 212 is outputted to an amplifier (hereinafter abbreviated to "AMP") 219 through an output part 217 and an LPF 214. The phase signal detecting circuit consists of the EXOR 212, the output part 213, and the LPF 214. Meanwhile, an output of the EXOR 216 is outputted to the AMP 219 through an output part 217 and an LPF 218. The reference circuit consists of the delay circuit 215, the EXOR 216, the output part 217, and the LPF 218. The AMP 219 outputs an output according to the outputs of the LPF 214 and the LPF 218 to a control terminal of the VCO 220.

In the timing circuit as such, when various patterns of the received signals, such as "1010" and "11001100", are received, the outputs of the phase signal detecting circuit and the reference circuit change according to a space-to-mark transition-probability.

FIGS. 18(a) and 18(b) are time charts of the timing circuit shown in FIG. 17. FIG. 18(a) shows the case where the space-to-mark transition-probability is 1, and FIG. 18(b) shows the case where the space-to-mark transition-probability is 0.5. In FIGS. 18(a) and 18(b), the input signal in FIG. 17, the output of the VCO 220, the output of the D-FF 211, the output of the output part 213, and the output of the output part 217 are shown from the top.

When the phase of the timing clock is set as 0, the both change at the same rate, which results in that the phase of the timing clock is fixed at approximately 0 irrespective of the space-to-mark transition-probability. As a result, the discrimination point is almost fixed, and hence the received signal is reproduced at a predetermined error rate.

The space-to-mark transition-probability is the probability of the signal changing from a mark ("1") to a space ("0") (the probability of the signal changing from the space to the mark).

For example, when the digital signals are "11110000", the change occurs at a rate of one bit in four bits, and hence the space-to-mark transition-probability is 0.25. When the digital signals are "11001100", the changes occur at a rate of one bit in two bits, and hence the space-to-mark transition-probability is 0.5. When the digital signals are "10101010", the changes occur at every bit, and hence the space-to-mark transition-probability is 1.

In order to lower the error rate, it is necessary for the discrimination point to set the phase of the timing clock other than at 0, in accordance with the state of the waveform deterioration of the received signal.

Incidentally, the state of the waveform deterioration of the received signal can be determined with reference to vertical eye opening and horizontal eye opening of an eye pattern (eye diagram).

When the discrimination point is set at the phase where the phase of the timing clock is not 0, a change ratio of the output of the phase signal detecting circuit which changes according to the space-to-mark transition-probability and a change ratio of the output of the reference circuit are different from each other in the above-described circuit. Hence, the phase of the timing clock is deviated from the set value when the space-to-mark transition-probability changes. Namely, the discrimination point changes according to the change of the space-to-mark transition-probability.

Moreover, a frequency pull-in range (capture range) of the PLL circuit is narrow. Further, even though the frequency of the optical signal (bit rate) is determined at a predetermined value, a self-oscillation frequency of the VCO fluctuates according to change of environments such as power source, temperature, and secular change. Hence, there is a possibility that the frequency of the optical signal is deviated from the frequency pull-in range of the PLL circuit. In this case, the timing clock is not generated as designed, and hence the optical receiving apparatus does not operate normally.

The EQL is structured by including, for example, a low-pass filter and a high-frequency emphasis circuit, which are connected in cascade. When the signals exceeding one gigabit are inputted to the EQL as such, it is necessary to obtain impedance matching between the low-pass filter, the high-frequency emphasis circuit and the like. However, a reflection characteristic out of a pass band of the low-pass filter such as a Bessel-Thomson filter is poor, and it is difficult to obtain the impedance matching when the circuits are connected through a wire bonding.

FIGS. 19(a) and 19(b) are views of the structure of the optical receiving apparatus in which a conventional EQL is shown in detail. FIG. 19(a) is a block diagram, and FIG. 19(b) is a schematic view showing mounting statuses of the circuits.

As shown in FIG. 19(a), a negative terminal of a power source 231 is grounded, and an output of a positive terminal thereof is inputted to an AMP 236 through a photodiode 232 as a photoreceptor, a pre-amplifier 233, a Bessel-Thomson filter 234, and a high-frequency emphasis circuit 235. An output of the AMP 236 is inputted to a timing circuit 238 and a DEC 237, the timing circuit 238 extracts a clock signal and its output is inputted to the DEC 237, and the DEC 237 reproduces the signal and outputs the reproduced signal.

Further, in FIG. 19(b), the pre-amplifier 233 and the Bessel-Thomson filter 234 are connected through wire bondings 241 as a connecting unit and microstrip lines 242 as a transmission line. The Bessel-Thomson filter 234 and the high-frequency emphasis circuit 235, and the high-frequency emphasis circuit 235 and the AMP 236 are connected similarly.

SUMMARY OF THE INVENTION

It is a first object of the present invention to provide a PLL circuit which keeps a discrimination point almost fixed irrespective of a space-to-mark transition-probability, even when a phase of a timing clock is set other than at 0.

It is a second object of the present invention to provide the PLL circuit, which can securely lock a VCO irrespective of environmental changes.

It is a third object of the present invention to provide an optical repeating apparatus, an optical terminal apparatus and an optical communication system, which operate at a predetermined error rate.

It is a fourth object of the present invention to provide the optical repeating apparatus, the optical terminal apparatus and the optical communication system, which deal with signals at a gigabit level.

It is a fifth object of the present invention to reduce the size of a PLL circuit, the optical repeating apparatus, and the optical terminal apparatus.

It is a sixth object of the present invention to reduce the power consumption in the PLL circuit, the optical repeating apparatus, and the optical terminal apparatus.

It is a seventh object of the present invention to provide the PLL circuit, the optical repeating apparatus, and the optical terminal apparatus at low cost.

It is possible to achieve the above objects by adjusting an output of a phase comparator according to the space-to-mark transition-probability of an input signal so that an output of a voltage controlled oscillator has a predetermined frequency and phase, in the PLL circuit.

When the input signal is a pulse, for example, the output of the phase comparator can be adjusted by adjusting an amplitude of the pulse. Further, when the input signal is a pulse, for example, the output of the phase comparator can be adjusted by adjusting the time width of the pulse.

Moreover, it is possible to achieve the above objects by supplying a low-frequency signal to a control terminal of the voltage controlled oscillator for controlling its oscillation frequency, in the above-described PLL circuit.

Further, it is possible to achieve the above objects by providing the PLL circuit as such in the optical repeating apparatus, the optical terminal apparatus and the optical communication apparatus.

Furthermore, it is possible to achieve the above objects by applying a circuit suitable for integration to an equalizing amplifier of 3R repeating.

As described above, according to the present invention, the discrimination point can be kept almost fixed irrespective of the space-to-mark transition-probability, even when the phase of the timing clock is set other than at 0. Further, according to the present invention, the VCO can be securely locked irrespective of the environmental changes. Furthermore, according to the present invention, it is possible to lower the error rate, allow gigabit-level-signal input, and reduce the size, the power consumption, and the cost in the circuits and apparatuses.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIGS. 19(a) and 19(b) are views showing the structure of the optical receiving apparatus in which a conventional EQL is shown in detail.

DESCRIPTION OF THE PREFERRED EMBODIMENTS

Hereinafter, preferred embodiments will be explained with reference to the drawings. The same numerals and symbols are given to designate the same structures in the respective drawings, and explanations thereof will be omitted.

An explanation about a first embodiment will be given.
(Structure of First Embodiment)

The first embodiment is the embodiment of an optical communications system to which the present invention is applied.

Figure 1:
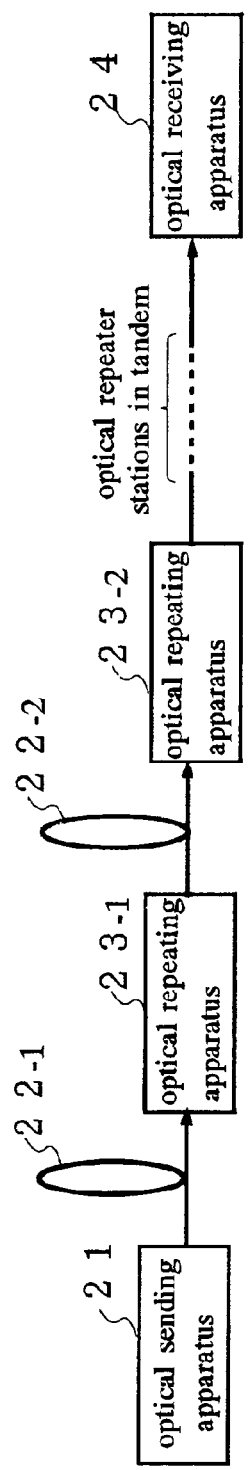
FIG. 1 is a view showing the structure of an optical communication system according to a first embodiment.

As shown in FIG. 1, the optical communication system according to the first embodiment is structured by including an optical sending apparatus 21 for sending an optical signal, an optical transmission line 22 for transmitting the sent optical signal, an optical receiving apparatus 24 for receiving the transmitted optical signal, and optical repeating apparatuses 23 being placed in the optical transmission line 22, for compensating wavelength deterioration due to transmission loss and wavelength dispersion of the optical transmission line 22.

The number of the optical repeating apparatuses 23 to be installed is determined in consideration of a transmission distance between the optical sending apparatus 21 and the optical receiving apparatus 24, transmission loss, wavelength dispersion and so on of the optical transmission line 22, an error rate required for the optical communication system, and the like.

The optical signal which is generated in the optical sending apparatus 21 transmits through the optical transmission line 22 to be received in an optical receiving part of the optical repeating apparatus 23. The optical receiving part subjects the received optical signal to 3R repeating. The reproduced optical signal is transmitted again to the optical transmission line 22 from an optical sending part. The optical signal transmitted through the optical transmission line 22 is received in an optical receiving part of the optical receiving apparatus 24, and information is removed from the optical signal.

At this point, 3R includes reshaping, retiming, and regenerating.

Next, the structure of the optical receiving part which is provided in the aforementioned optical repeating apparatuses 23 and the optical receiving apparatus 24 will be explained.

Figure 2:
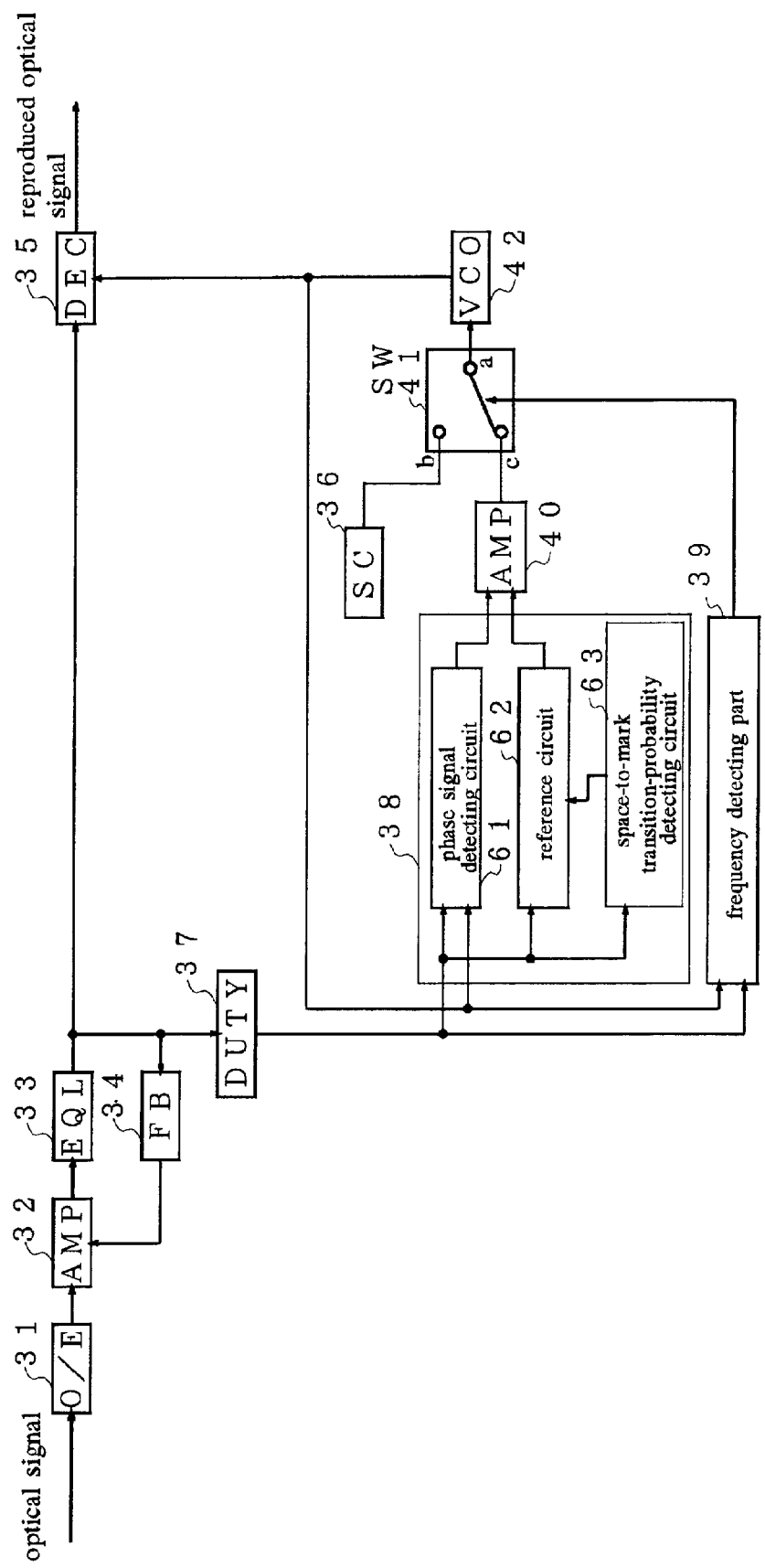
FIG. 2 is a block diagram of an optical receiving part according to the first embodiment.

As shown in FIG. 2, the received optical signal is received in an O/E 31, and converted from the optical signal to an electric signal. The O/E 31 can be structured by including an element, which can convert light to electricity, such as a pin photodiode, an avalanche photodiode or the like.

The converted signal is inputted to an AMP 32 and amplified to a predetermined level. The AMP 32 is a pre-amplifier for compensating transmission loss or the like which is generated in the optical transmission line 22.

The amplified signal is inputted to an EQL 33. The pulse optical signal, which is subjected to attenuation and distortion by the optical transmission line 22, is converted to become this inputted signal, and hence its waveform is deteriorated. Therefore, the EQL 33 amplifies the signal and equalizes the signal so that its waveform is suitable for discrimination, with minimum effects of noise and inter-code interference.

An output of the EQL 33 is inputted to a feedback circuit (hereinafter abbreviated to "FB") 34, a DEC 35, and a duty circuit (hereinafter abbreviated to "DUTY") 37.

The FB 34 feeds back the output of the EQL 33 to the AMP 32 at a predetermined level.

The DEC 35 discriminates whether the signal from the EQL 33 is larger or smaller than a predetermined threshold at a discrimination point, thereby reproducing the signal. This discrimination point is given by a phase of a timing clock, which is generated by a later-described VCO 42.

The DUTY 37 adjusts a level of a cross point in an eye pattern to almost the center between a "1" level and a "0" level, thereby reshaping the signal from the EQL 33 so that pulse widths of a mark and a space are almost equal to each other. The waveform is thus reshaped in the DUTY 37 so that the timing clock can be extracted from a main signal correctly in a PLL circuit which consists of a later-described phase comparing part 38, an SW 41, and a VCO 42. An output of the DUTY 37 is inputted to the phase comparing part 38 and a frequency detecting part 39.

Meanwhile, an output of the VCO 42 is also inputted to the phase comparing part 38 and the frequency detecting part 39. The VCO 42 is an oscillator whose oscillation frequency changes according to a control voltage.

The frequency detecting part 39 detects a frequency difference between the output of the DUTY 37 and the output of the VCO 42, and outputs an output based on the frequency difference to a control terminal of the switch (hereinafter abbreviated to "SW") 41.

The phase comparing part 38 is structured by including a phase signal detecting circuit 61, a reference circuit 62, and a space-to-mark transition-probability detecting circuit 63. The output of the DUTY 37 which is inputted to the phase comparing part 38 is inputted to the phase signal detecting circuit 61, the reference circuit 62, and the space-to-mark transition-probability detecting circuit 63. Further, the output of the VCO 42 which is inputted to the phase comparing part 38 is inputted to the phase signal detecting circuit 61.

The space-to-mark transition-probability detecting circuit 63 detects a space-to-mark transition-probability of the signal (the optical signal received in the O/E 31) based on the output of the DUTY 37, and outputs an output based on the detecting result to the reference circuit 62.

The phase signal detecting circuit 61 outputs a voltage based on a phase difference between the outputs of the DUTY 37 and VCO 42 to an AMP 40.

The reference circuit 62 outputs a voltage based on the output of the space-to-mark transition-probability detecting circuit 63, irrespective of the phase difference between the outputs of the DUTY 37 and VCO 42 to the AMP 40.

The AMP 40 outputs a voltage based on a difference between the output voltages of the phase signal detecting circuit 61 and the reference circuit 62 to a terminal c of the SW 41.

The SW 41 is a 3-terminal switch whose connection state is controlled by an output of the frequency detecting part 39. A terminal a of the SW 41 is connected to a control voltage terminal of the VCO 42 to which the control voltage for controlling the oscillation frequency is supplied. A terminal b of the SW 41 is connected to an output terminal of a sweep control circuit (hereinafter abbreviated to "SC") 36 as a low-frequency oscillator. The terminal c of the SW 41 is connected to the output terminal of the AMP 40, as described above.

Next, an example of the circuit of the EQL 33 in thus-structured optical receiving part will be explained.

Figure 3:
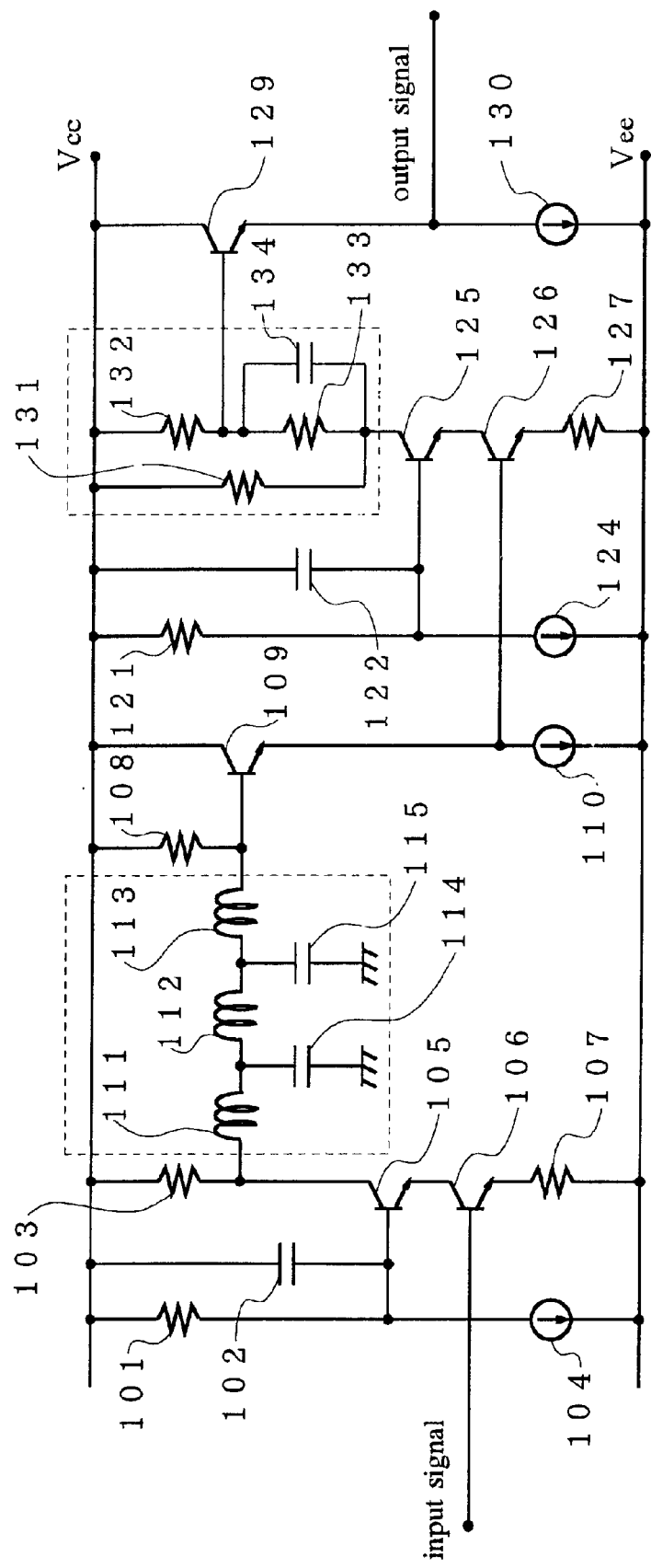
FIG. 3 is a circuit diagram of an equalizing amplifier according to the first embodiment.

As shown in FIG. 3, the EQL 33 is structured by including resistors 101, 103, 107, 108, 121, 127, 131, 132, and 133, transistors 105, 106, 109, 125, 126, and 129, condensers 102, 114, 115, 122, and 134, inductors 111, 112, and 113, and current sources 104, 110, 124, and 130.

An output of the AMP 32 is inputted to a base terminal of the transistor 106. An emitter terminal of the transistor 106 is connected to a power source Vee through the resistor 107. Further, a collector terminal of the transistor 106 is connected to an emitter terminal of the transistor 105.

A base terminal of the transistor 105 is connected to the resistor 101 and the condenser 102 which are connected in parallel between this base terminal and a power source Vcc, and is connected to the power source Vee through the current source 104. A collector terminal of the transistor 105 is connected to the power source Vcc through the resistor 103 and is connected to one end of the inductor 111.

The other end of the inductor 111 is connected to one end of the resistor 108 and a base terminal of the transistor 109 through the inductor 112 and the inductor 113 which are connected in series. The other end of the resistor 108 is connected to the power source Vcc.

Moreover, a connection point between the inductor 111 and the inductor 112 is grounded through the condenser 114, and a connection point between the inductor 112 and the inductor 113 is grounded through the condenser 115.

Namely, the inductors 111, 112, and 113 and the condensers 114 and 115 form a T-shaped fifth-order Bessel-Thomson filter of L-C-L constitution. The fifth-order Bessel-Thomson filter has a gain as a function of wavelength, which is close to a Gaussian characteristic with small waveform interference, and hence it is suitable for a low-pass filter.

A collector terminal of the transistor 109 is connected to the power source Vcc, and an emitter terminal thereof is connected to the power source Vee through the current source 110, and is connected to a base terminal of the transistor 126.

An emitter terminal of the transistor 126 is connected to the power source Vee through the resistor 127. A collector terminal of the transistor 126 is connected to an emitter terminal of the transistor 125.

A base terminal of the transistor 125 is connected to the resistor 121 and the condenser 122 which are connected in parallel between the base terminal and the power source Vcc, and is connected to the power source Vee through the current source 124. A collector terminal of the transistor 125 is connected to the power source Vcc through the resistor 131, and is connected to the power source Vcc through the resistor 133 and the resistor 132, which are connected in series. Namely; the resistor 131 and the serially connected resistors 133 and 132 are connected in parallel. Further, the condenser 134 is connected to the resistor 133 in parallel. Namely, one end of the condenser 134 is connected to the collector terminal of the transistor 125.

Moreover, a connection point between the resistor 133 and the resistor 132 is connected to a base terminal of the transistor 129. A collector terminal of the transistor 129 is connected to the power source Vcc, and an emitter terminal thereof is connected to the power source Vee through the current source 130, and is connected to an output terminal which is connected to the DEC 35 and the like as described above.

The resistors 131, 132, 133, and 127, the condenser 134, the transistors 125 and 126 form a high-frequency emphasis circuit.

Incidentally, it is suitable to use a $\pi$-shaped fifth-order Bessel-Thomson filter of C-L-C constitution, instead of the T-shaped fifth-order Bessel-Thomson filter of L-C-L constitution. Further, the order of the Bessel-Thomson filter and the circuit element constant are determined based on a frequency response of the EQL.

Moreover, an input circuit, which consists of the resistor 103, the transistors 105 and 106, may be structured as a differential amplifying circuit. Further, the high-frequency emphasis circuit which consists of the resistors 131, 132, 133, and 127, the condenser 134, the transistors 125 and 126 may be structured as a differential amplifying circuit. Being structured as the differential amplifying circuit, it is possible for the EQL 33 to improve stability against common-mode noise such as power source noise, stability of characteristics against variations of fabrication process, stability against environmental changes such as temperature change, and the like.

Furthermore, the base ground transistors 105 and 125 are for preventing a mirror effect of the emitter ground transistors 106 and 126, and hence dispensable if there is a margin in a high-speed characteristic. In this case, the resistor 101, the condenser 102, the current source 104, the resistor 121, the condenser 122, and the condenser 124, which form a base potential supplying circuit of the base ground transistors 105 and 125, are unnecessary.

(Operation and Effect of First Embodiment)

Next, the operation and effect of the, optical receiving part like the above will be explained.

When the optical repeating apparatuses 23 and the optical receiving apparatus 24 which include the optical receiving part are installed in the optical communication system, the phase of the timing clock is set with reference to the eye pattern of the received optical signal. Especially, when the phase of the timing clock is set as the phase with maximum eye opening with reference to vertical eye opening and horizontal eye opening, a discrimination margin is increased, and hence the error rate can be lowered further.

Then, an output value of the space-to-mark transition-probability detecting circuit 63 is set based on the set phase.

When the optical receiving part receives the optical signal, the frequency detecting part 39 detects the difference between the frequency of the signal based on the received optical signal and the oscillation frequency of the VCO 42. When the difference of a detecting result exceeds a predetermined range, the frequency detecting part 39 outputs a control signal which corresponds to this case to the SW 41, and controls the SW 41 to connect the terminal a and the terminal b. Meanwhile, when the difference of the detecting result does not exceed the predetermined range, the frequency detecting part 39 outputs a control signal which corresponds to this case to the SW 41, and controls the SW 41 to connect the terminal a and the terminal c.

This predetermined range is set within a frequency pull-in range, which is peculiar to the PLL circuit consisting of the VCO 42, the phase comparing part 38 and the SW 41, while including the frequency of the signal corresponding to the received optical signal.

When the frequency detecting part 39 determines that the difference exceeds the predetermined range and the terminal a and the terminal b of the SW 41 are connected, a low-frequency voltage outputted from the SC 36 is supplied to the control voltage terminal of the VCO 42. Due to this low-frequency voltage, the oscillation frequency of the VCO 42 changes in a range exceeding the frequency pull-in range which is peculiar to the above-described PLL circuit, and the oscillation frequency of the VCO 42 becomes the frequency within the predetermined range at some point in time.

When the frequency becomes within the predetermined range, the SW 41 is controlled by the control signal of the frequency detecting part 39 to connect the terminal a and the terminal c. Since the VCO 42 is oscillating within the frequency pull-in range which is peculiar to the PLL circuit, the output of the VCO 42 is locked so as to oscillate at the phase of the timing clock which is initially set.

Thus, the frequency detecting part 39, the SC 36, and the SW 41 permit the frequency pull-in range of the VCO 42 to increase exceeding the frequency pull-in range, which is peculiar to the PLL circuit. The increased frequency pull-in range is determined by a voltage amplitude of the SC 36, and the voltage amplitude is designed according to expected operating environments of the optical receiving part. Hence, the VCO 42 can be securely locked irrespective of change of environments such as working temperature.

When the frequency detecting part 39 determines that the difference is within the predetermined range, the terminal a and the terminal c of the SW 41 are connected, and the phase comparing part 38 and the AMP 40 operate as follows.

Figure 4A:
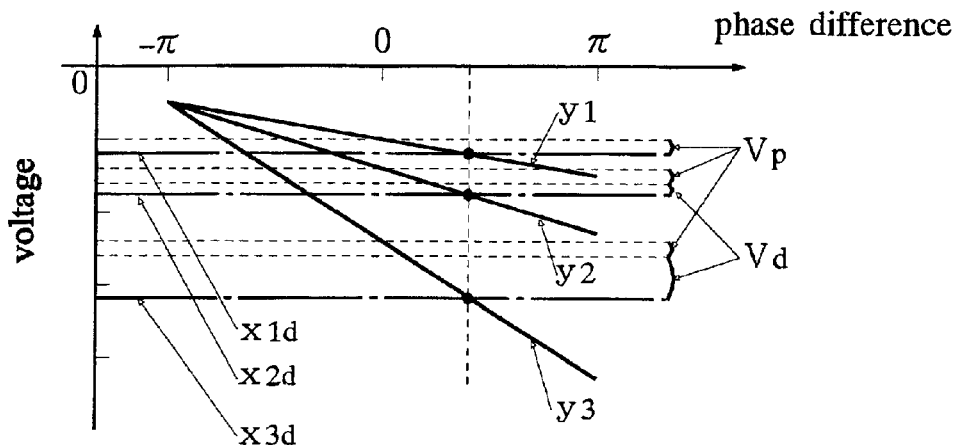
FIGS. 4(a), 4(b), and 4(c) are views showing the relationship between a phase of a timing clock and a space-to-mark transition-probability.
Figure 4B:
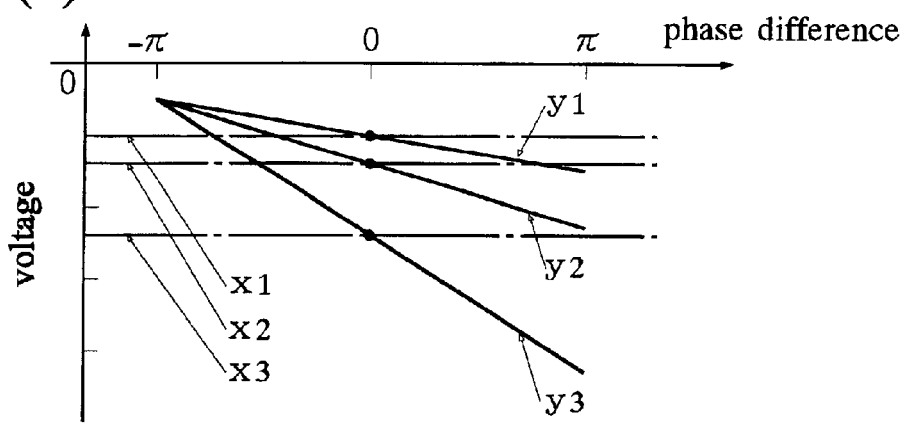
Figure 4C:
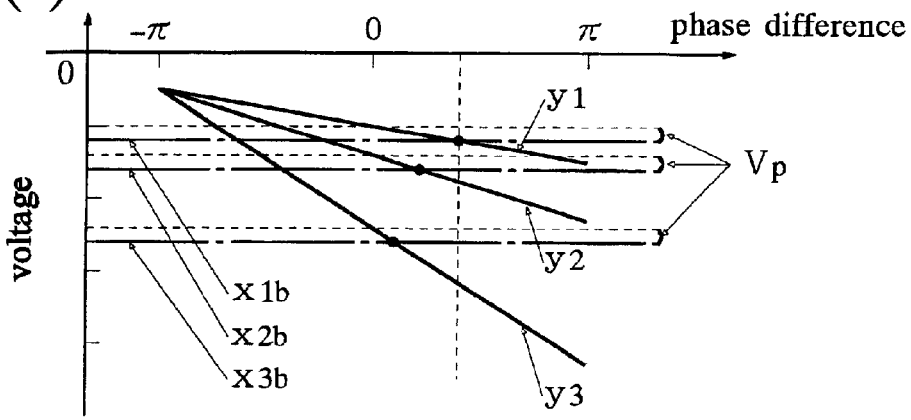

FIGS. 4(a), 4(b), and 4(c) are charts showing the relationship between the phase of the timing clock and the space-to-mark transition-probability. FIG. 4(a) shows the case where the phase of the timing clock is set other than at 0. FIG. 4(b) shows the case where the phase of the timing clock is set at 0, in which the phase comparing part 38 is structured without the space-to-mark transition-probability detecting circuit 63, that is, the phase comparing part is conventionally structured. FIG. 4(c) shows the case where the phase of the timing clock is set other than at 0, in which the phase comparing part 38 is structured without the space-to-mark transition-probability detecting circuit 63.

Vertical axes in FIGS. 4(a), 4(b), and 4(c) show the voltage and lateral axes show the phase difference. Further, each straight line in FIGS. 4(a), 4(b), and 4(c) shows the output of the phase signal detecting circuit 61, and each one-dotted chain line shows the output of the reference circuit 62. x1d, x1, x1b, and y1 show the case where the space-to-mark transition-probability is 0.25, x2d, x2, x2b, and y2 show the case where the space-to-mark transition-probability is 0.5, and x3d, x3, x3b, and y3 show the case where the space-to-mark transition-probability is 1. Furthermore, each point shows the phase where the VCO 42 is locked in each of the cases.

Note that, although the cases where the space-to-mark transition-probability is 0.25, 0.5, and 1 are shown, the similar chart can be made at any given space-to-mark transition-probability.

First, the relationship between the phase of the timing clock and the space-to-mark transition-probability, in the case where the phase comparing part 38 is structured without the space-to-mark transition-probability detecting circuit 63, will be explained.

In the case where the phase of the timing clock is set at 0, as shown in FIG. 4(b), when the space-to-mark transition-probability changes as 0.25, 0.5, and 1, the output of reference circuit 62 changes as x1, x2, and x3, proportionally to the change of the space-to-mark transition-probability. Further, as explained in Description of the Related Art, the output of the phase signal detecting circuit 61 changes as y1, y2, and y3, in the same proportional relationship as that of the reference circuit 62 which changes according to the change of the space-to-mark transition-probability.

Hence, even when the space-to-mark transition-probability changes, cross points (●) between the outputs of the reference circuit 62 and the outputs of the phase signal detecting circuit 61 with respect to the phase do not change relatively, and hence the cross points are at the phase difference 0.

When the phase of the timing clock is set other than at 0, as shown in FIG. 4(c), it is supposed that a bias of the reference circuit 62 is changed so that the phase is locked, at which, for example, when the space-to-mark transition-probability is 0.25. In FIGS. 4(a), 4(b), and 4(c), the bias which is set according to the phase of the timing clock is shown by Vp.

In this case, when the space-to-mark transition-probability changes as 0.25, 0.5, and 1, the output of the reference circuit 62 changes as x1b, x2b, and x3b based on the changed bias, proportionally to the change of the space-to-mark transition-probability. However, the output of the phase signal detecting circuit 61 changes as y1, y2, and y3, as above.

Hence, when the space-to-mark transition-probability changes, cross points (●) between the outputs of the reference circuit 62 and the outputs of the phase signal detecting circuit 61 with respect to the phase are at the phase differences being shifted from the set phase, except for the case where the space-to-mark transition-probability is 0.25. As a result, the discrimination point fluctuates according to the space-to-mark transition-probability.

Meanwhile, according to the present invention, the phase comparing part 38 is provided with the space-to-mark transition-probability detecting circuit 63, and the output of the reference circuit 62 is adjusted according to the space-to-mark transition-probability. Therefore, even when the phase of the timing clock is set other than at 0, cross points (●) between the outputs of the reference circuit 62 and the outputs of the phase signal detecting circuit 61 with respect to the phase are at the set phase difference. In FIGS. 4(a), 4(b), and 4(c), an adjusted amount, which is adjusted according to the space-to-mark transition-probability, is shown by Vd.

Namely, as shown in FIG. 4(a), when the space-to-mark transition-probability changes as 0.25, 0.5, and 1, the output of the reference circuit 62 changes as x1d, x2d, and x3d according to the change of the space-to-mark transition-probability, each of which is a value added with the bias Vp being set according to the phase of the timing clock further added with the adjusted amount Vd being adjusted according to the space-to-mark transition-probability. The output of the phase signal detecting circuit 61 changes as y1, y2, and y3, as above.

As a result, the discrimination point is fixed irrespective of the fluctuation of the space-to-mark transition-probability, and therefore, it is possible to lower the error rate.

Next, the adjusted amount Vd according to the space-to-mark transition-probability will be explained in more concrete with reference to FIGS. 5(a), 5(b), and 5(c).

Figure 5A:
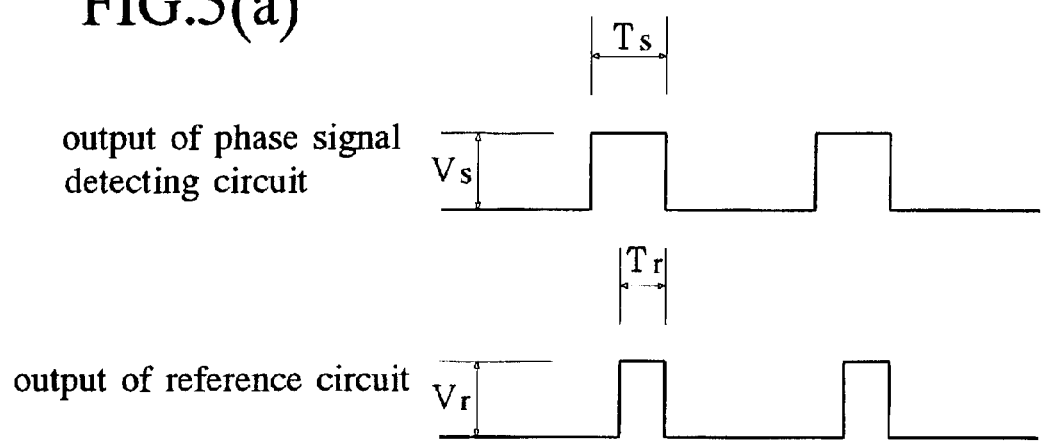
FIGS. 5(a), 5(b), and 5(c) are views showing how to adjust a bias according to the space-to-mark transition-probability.
Figure 5B:
Figure 5C:
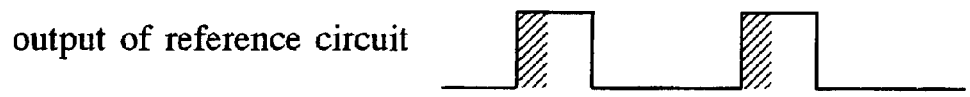

In FIGS. 5(a), 5(b), and 5(c), FIG. 5(a) shows the output of the phase signal detecting circuit and the output of the reference circuit before adjustment. FIG. 5(b) shows the output of the reference circuit after the pulse amplitude is adjusted, in adjusting the output of the reference circuit. FIG. 5(c) shows the output of the reference circuit after the pulse width is adjusted, in adjusting the output of the reference circuit.

In order to obtain the set phase irrespective of the fluctuation of the space-to-mark transition-probability when the phase of the timing clock is set other than at 0, it is necessary to make the product of a time of a "1" level and a voltage of one bit of the output of the phase signal detecting circuit 61 and the product of a time of a "1" level and a voltage of one bit of the output of the reference circuit 62 equal to each other.

Namely, supposing that the time of the "1" level and the voltage of one bit of the phase signal detecting circuit 61 are Ts and Vs, and the time of the "1" level and the voltage of one bit of the reference circuit 62 are Tr and Vr, respectively, it becomes $$Ts \times Vs = Tr \times Vr \quad (1)$$

In realizing the (expression 1), there is a method of adjusting the amplitude according to the space-to-mark transition-probability while keeping the pulse width (time width of the pulse) of the reference circuit 62 fixed, as shown in FIG. 5(b). Additionally, there is a method of adjusting the pulse width according to the space-to-mark transition-probability while keeping the pulse amplitude of the reference circuit 62 fixed, as shown in FIG. 5(c). Shaded parts of FIGS. 5(b) and 5(c) show the adjusted amounts, which are adjusted according to the space-to-mark transition-probability.

Similarly, the output pulse of the phase signal detecting circuit 61 may be adjusted.

Next, the structure of the phase comparing circuit 38 will be explained in more concrete as an example of the circuit for adjusting the pulse amplitude.

Figure 6:
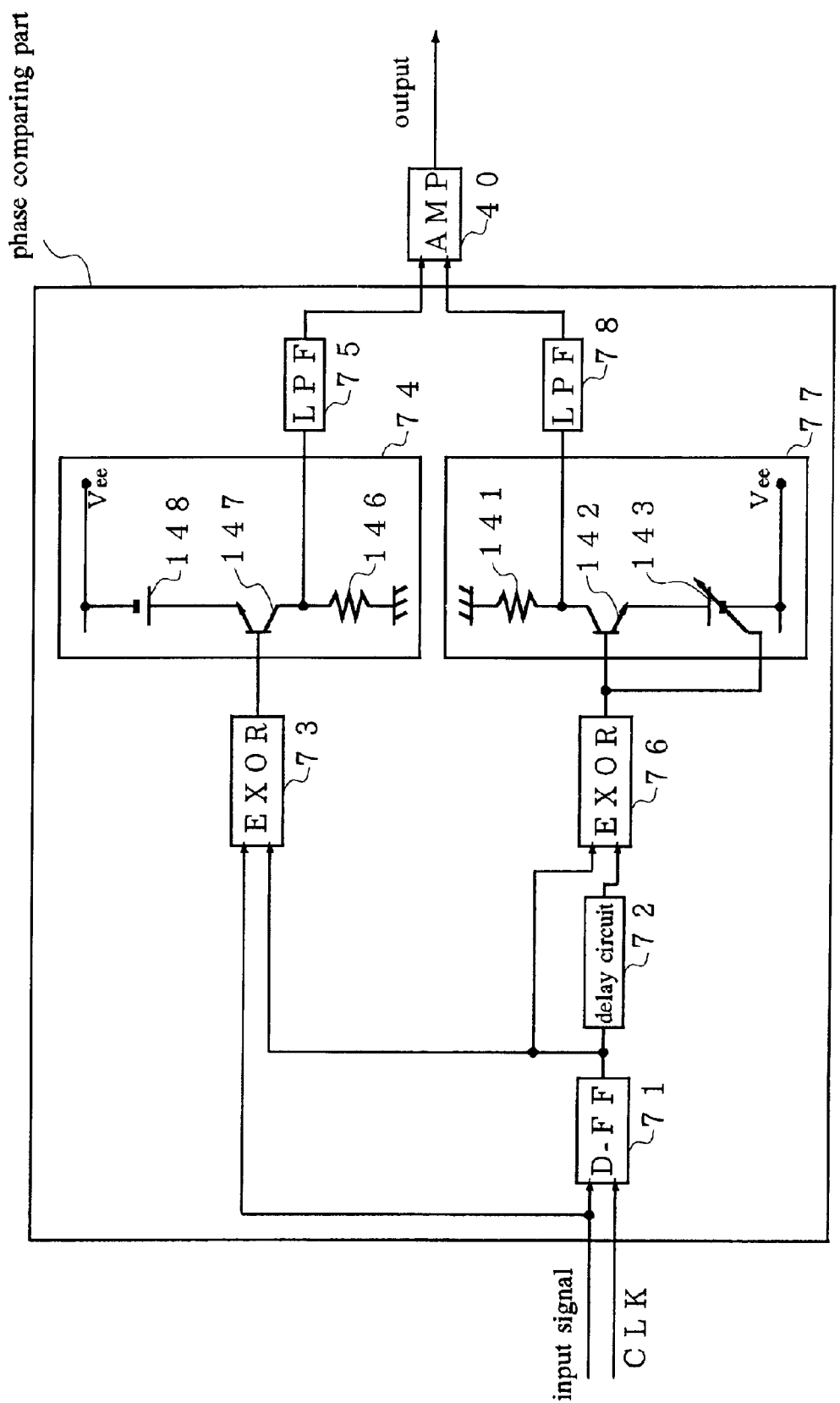
FIG. 6 is a view showing the structure of a phase comparing part according to the first embodiment.

In FIG. 6, the output of the DUTY 37 (FIG. 2) is inputted to a D flip-flop circuit (hereinafter abbreviated to "D-FF") 71 and an exclusive OR circuit (hereinafter abbreviated to "EXOR") 73, respectively. Then, the output of the VCO 42 (FIG. 2) is inputted to a clock input of the D-FF 71.

The D-FF 71 delays the output of the DUTY 37 for one clock in synchronization with the timing clock supplied by the output from the VCO 42, and outputs it. The output of the D-FF 71 is inputted to a delay circuit 72, the EXOR 73, and an EXOR 76, respectively.

The delay circuit 72 delays the input by a half cycle and outputs it to the EXOR 76. The EXOR 76 obtains an exclusive OR of the output of the D-FF 71 and the output of the delay circuit 72, and outputs the result to a variable amplifier 77. The EXOR 73 obtains an exclusive OR of the output of the DUTY 37 and the output of the D-FF 71, and outputs the result to an amplifier 74.

The variable amplifier 77 is structured by a resistor 141, a transistor 142, and a variable voltage source 143. The output of the EXOR 76 which is inputted to the variable amplifier 77 is connected to a base terminal of the transistor 142 and a control terminal of the variable voltage source 143, respectively. A collector terminal of the transistor 142 is grounded through the resistor 141. An emitter terminal of the transistor 142 is connected to the power source Vee through the variable voltage source 143.

An output of the variable amplifier 77 is taken out as a voltage between both ends of the resistor 141, and outputted to a low-pass filter (hereinafter abbreviated to "LPF") 78. The LPF 78 outputs an average voltage of the output of the variable amplifier 77 as an output of the phase comparing part to the AMP 40.

The AMP 74 is structured by a resistor 146, a transistor 147, and a voltage source 148. The output of the EXOR 73, which is inputted to the AMP 74, is connected to a base terminal of the transistor 147. A collector terminal of the transistor 147 is grounded through the resistor 146. An emitter terminal of the transistor 147 is connected to the power source Vee through the voltage source 148.

An output of the AMP 74 is taken out as a voltage between both ends of the resistor 146, and outputted to an LPF 75. The LPF 75 outputs an average voltage of the output of the AMP 74 as an output of the phase comparing part to the AMP 40.

The AMP 74 is the circuit provided for keeping symmetry of the reference circuit 62 and the phase signal detecting circuit 61 since the reference circuit 62 is structured by including the variable amplifier 77. By keeping the symmetry of the circuit, it is possible to lower a signal-to-noise ratio. Hence, the AMP 74 is dispensable for this reason.

The phase signal detecting circuit 61 (FIG. 2) is structured by the EXOR 73, the AMP 74, and the LPF 75, and the reference circuit 62 (FIG. 2) is structured by the delay circuit 72, the EXOR 76, the variable amplifier 77, and the LPF 78. Further, the space-to-mark transition-probability detecting circuit 63 (FIG. 2) is structured by the delay circuit 72 and the EXOR 76. Namely, a part of the reference circuit 62 functions as the space-to-mark transition-probability detecting circuit 63.

Figure 7:
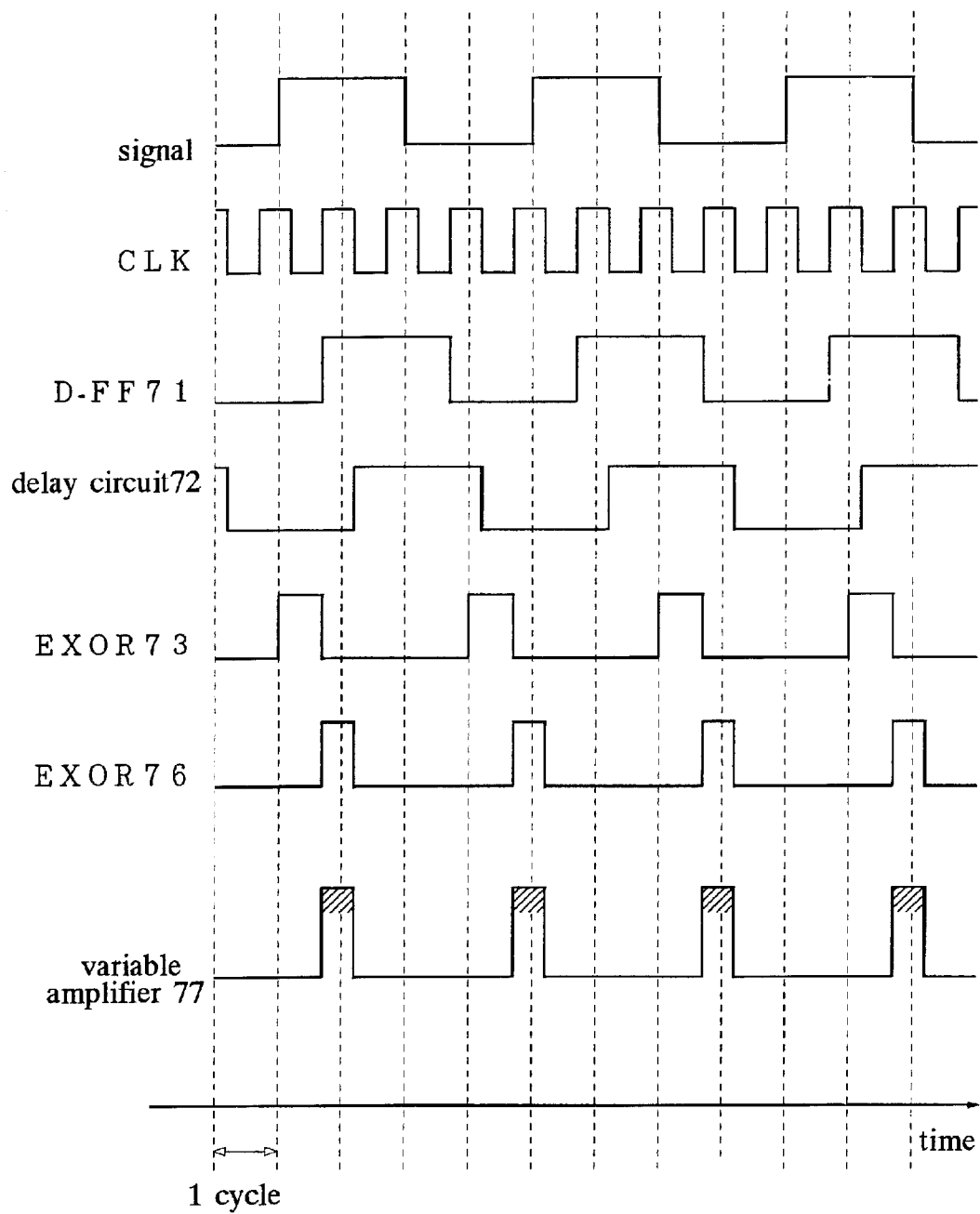
FIG. 7 is a time chart of the phase comparing part shown in FIG. 6.

FIG. 7 is a time chart of the phase comparing part, in the case where the space-to-mark transition-probability is 0.5.

In FIG. 7, the signal, the clock, the output of the D-FF 71, the output of the delay circuit 72, the output of the EXOR 73, the output of the EXOR 76, and the output of the variable amplifier 77 are shown from the top.

As shown in FIG. 7, in the variable amplifier 77, the voltage of the variable voltage source 143 is controlled by the control signal based on the space-to-mark transition-probability from the EXOR 76, that is, the gain is changed, and the variable amplifier 77 amplifies the output of the EXOR 76 which is inputted to the transistor 142 by the voltage shown by the shaded part in FIG. 7.

Hence, the product of a time of a "1" level and a voltage of one bit of the output of the AMP 74 and the product of a time of a "1" level and a voltage of one bit of the output of the variable amplifier 77 become equal to each other, as described above.

As a result, the pulse amplitude is adjusted according to the space-to-mark transition-probability no matter how the phase of the timing clock is set, and therefore, the set phase of the timing clock is kept almost fixed, irrespective of the fluctuation of the space-to-mark transition-probability.

Next, the structure of the phase comparing circuit 38 will be explained in more concrete as an example of the circuit for adjusting the pulse width.

Figure 8:
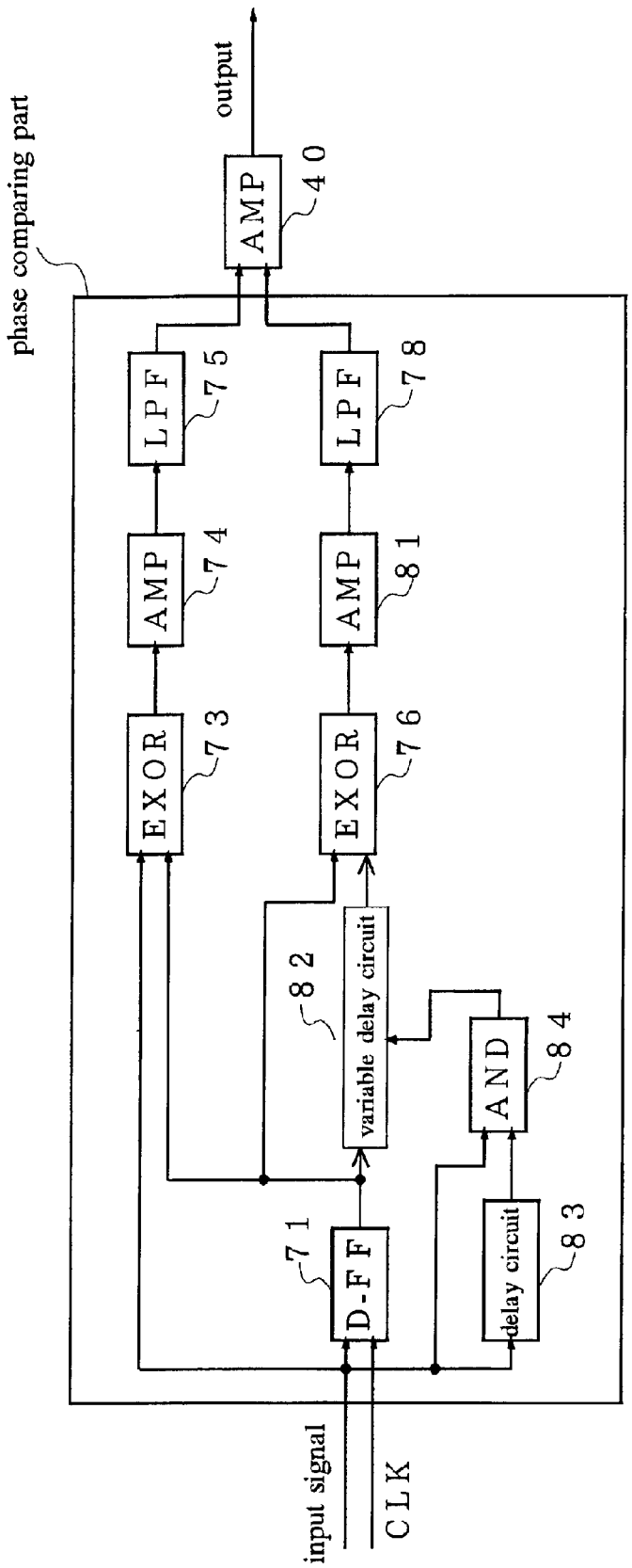
FIG. 8 is a view showing the structure of another phase comparing part according to the first embodiment.

In FIG. 8, the output of the DUTY 37 (FIG. 2) is inputted to the D-FF 71, the EXOR 73, a delay circuit 83, and an AND circuit (hereinafter abbreviated to "AND") 84, respectively. Then, the output of the VCO 42 (FIG. 2) is inputted to the clock input of the D-FF 71.

The delay circuit 83 delays the input by a half cycle and outputs it to the AND 84. The AND 84 obtains an AND of the output of the DUTY 37 and the output of the delay circuit by 83, and outputs the result to a control terminal of a variable delay circuit 82 for controlling its delay time.

An output of the D-FF 71 is inputted to the variable delay circuit 82, the EXOR 73, and the EXOR 76, respectively.

The variable delay circuit 82 delays the input by cycles corresponding to the control signal from the AND 84, and outputs it to the EXOR 76.

An output of the EXOR 76 is amplified in an AMP 81 and outputted to the LPF 78. An output of the LPF 78 is inputted to the AMP 40 as the output of the phase comparing part. An output of the EXOR 73 is amplified in the AMP 74 and outputted to the LPF 75. An output of the LPF 75 is inputted to the AMP 40 as the output of the phase comparing part. Incidentally, the circuit structure of the AMP 81 is the same as that of the AMP 74.

The phase signal detecting circuit 61 (FIG. 2) is structured by the EXOR 73, the AMP 74, and the LPF 75, and the reference circuit 62 (FIG. 2) is structured by the variable delay circuit 82, the EXOR 76, the AMP 81, and the LPF 78. Further, the space-to-mark transition-probability detecting circuit 63 (FIG. 2) is structured by the delay circuit 83 and the AND 84.

Hence, the output of the AND 84 is the signal corresponding to the space-to-mark transition-probability, and the delay time of the variable delay circuit 82 is controlled by this signal. Therefore, the pulse width is adjusted by the time width shown by the shaded part, as shown in FIG. 5(c).

For this reason, the product of a time of a "1" level and a voltage of one bit of the output of the AMP 74 and the product of a time of a "1" level and a voltage of one bit of the output of the AMP 81 become equal to each other, as described above.

As a result, the pulse width is adjusted according to the space-to-mark transition-probability no matter how the phase of the timing clock is set, and therefore, the set phase of the timing clock is kept almost fixed, irrespective of the fluctuation of the space-to-mark transition-probability.

Next, the circuit structure of the variable delay circuit 82 will be explained in more concrete as an example of the circuit for adjusting the delay time.

Figure 9:
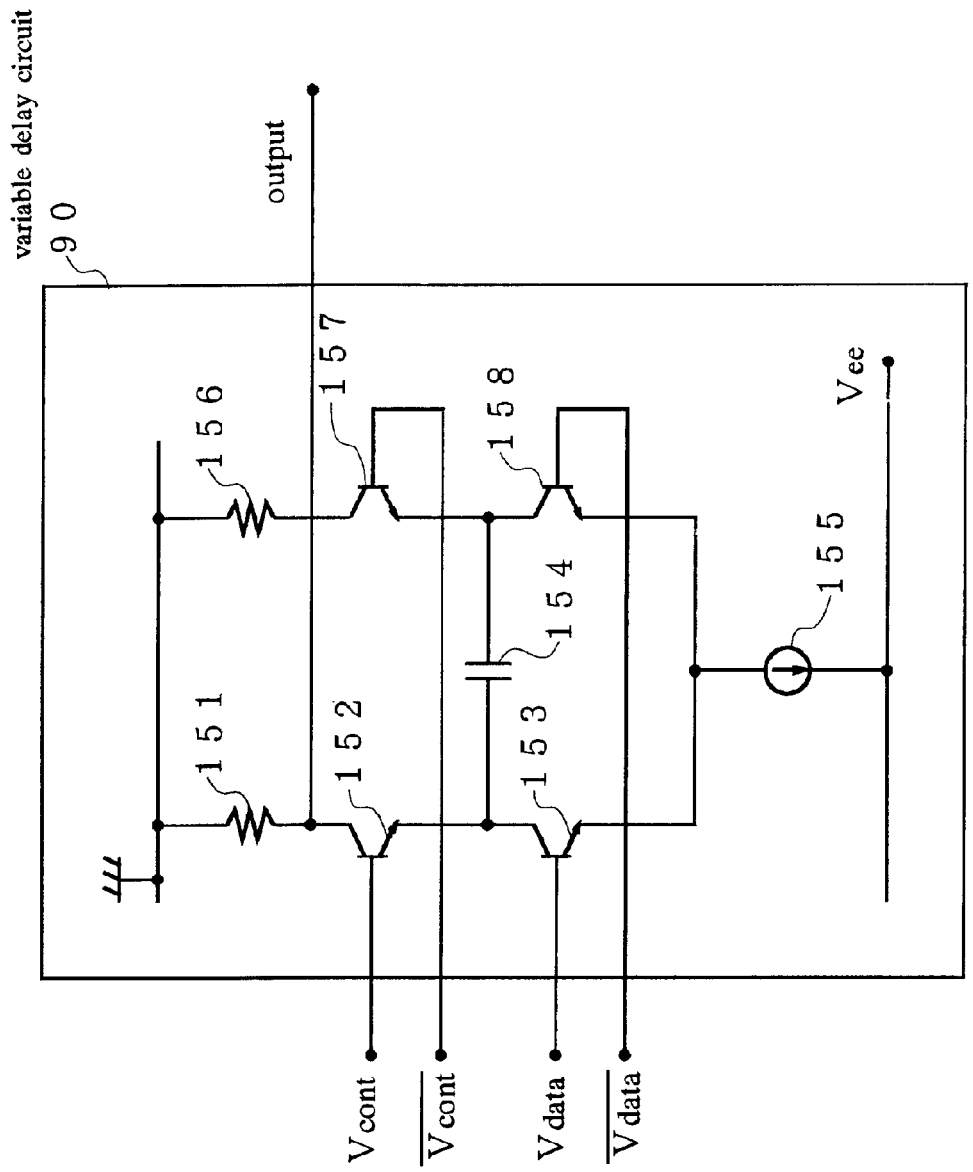
FIG. 9 is a circuit diagram showing an example of a variable delay circuit.

In FIG. 9, a control signal (Vcont) based on the output of the AND 84 (FIG. 8) is inputted to a base terminal of a transistor 152, and an inverting output which is the inverted control signal Vcont is inputted to a base terminal of a transistor 157. Incidentally, in FIG. 9, the inverting output of the control signal Vcont is shown by overlining the Vcont.

Moreover, an output (Vdata) of the D-FF 71 (FIG. 8) is inputted to a base terminal of a transistor 153, and an inverting output which is the inverted output Vdata of the D-FF 71 is inputted to a base terminal of a transistor 158. Incidentally, in FIG. 9, the inverting output of the output Vdata is shown by overlining the Vdata.

A collector terminal of the transistor 152 is grounded through a resistor 151, and its emitter terminal is connected to a collector terminal of the transistor 153. A collector terminal of the transistor 157 is grounded through a resistor 156, and its emitter terminal is connected to a collector terminal of the transistor 158.

The collector terminals of the transistor 153 and the transistor 158 are connected to each other through a condenser 154. Further, emitter terminals of the transistor 153 and the transistor 158 are connected to each other, and its contact is connected to the power source Vee through a current source 155.

In the circuit like the above, the delay time depends on a charge amount of the condenser 154. Further, the charge amount depends on amplitude of the Vcont, which is inputted in synchronization with the mark of the Vdata. When the amplitude of the Vcont is changed based on the output of the AND 84, the delay time is controlled according to the space-to-mark transition-probability.

Incidentally, in FIG. 6 and FIG. 8, the reference circuit 62 is provided with the variable amplifier 77 and the variable delay circuit 82 so that the pulse amplitude and the pulse width of the reference circuit 62 are adjusted. However, when the phase signal detecting circuit 61 is provided with the similar variable amplifier and variable delay circuit, it is possible to adjust the pulse amplitude and the pulse width of the phase signal detecting circuit 61. The objects of the, present invention may be achieved by the structure as above.

Meanwhile, in the EQL 33 whose circuit is structured as above, a high-frequency component of the input signal is cut by the Bessel-Thomson filter, and the input signal is amplified in the high-frequency emphasis circuit to be equalized and amplified.

In the high-frequency emphasis circuit, when the frequency of the input signal is low, impedance of the condenser 134 is large, and hence combined impedance of the parallel circuit consisting of the resistor 133 and the condenser 134 is generated between the collector terminal of the transistor 125 and the base terminal of the transistor 129. Further, when the frequency of the input signal is high, the impedance of the condenser 134 is small, and hence a short circuit is established between the collector terminal of the transistor 125 and the base terminal of the transistor 129.

Therefore, the high-frequency emphasis circuit can change the gain at a boundary of a cut-off frequency, which is determined by the resistor 133 and the condenser 134, between parts lower than and higher than the cut-off frequency, so that the gain in the high-frequency part is increased.

Furthermore, in the EQL 33, the influence of reflection of the Bessel-Thomson filter can be eliminated by the circuit consisting of the transistor 109 and the current source 110, and the influence of reflection of the high-frequency emphasis circuit can be eliminated by the circuit consisting of the transistor 129 and the current source 130.

The EQL 33 whose circuit is structured as above can be formed on a semiconductor chip. Hence, it can be formed on the same semiconductor chip on which the AMP 32 is formed. Further, other circuits shown in FIG. 2, such as the FB 54, the DUTY 37, the DEC 35, and the like, can be formed on the same semiconductor chip as well. Since the EQL 33 can be formed on the same semiconductor chip together with other circuits as described above, it is possible to reduce mismatching points of the interface between the circuits. Hence, it is possible for the optical receiving part to reduce the waveform deterioration due to impedance mismatching.

Next, an explanation about a second embodiment will be given.

(Structure of Second Embodiment)

The second embodiment is the embodiment of an optical communication system to which the present invention is applied.

The optical communication system according to the second embodiment is structured by including an optical sending apparatus 21 for sending an optical signal, an optical transmission line 22 for transmitting the sent optical signal, an optical receiving apparatus 24 for receiving the transmitted optical signal, and optical repeating apparatuses 23 being placed in the optical transmission line 22.

Since these are the same as those of the optical communication system according to the first embodiment, explanation thereof will be omitted. Hereinafter, the structure of an optical receiving part which is provided in the optical repeating apparatuses 23 and the optical receiving apparatus 24 will be explained.

Figure 10:
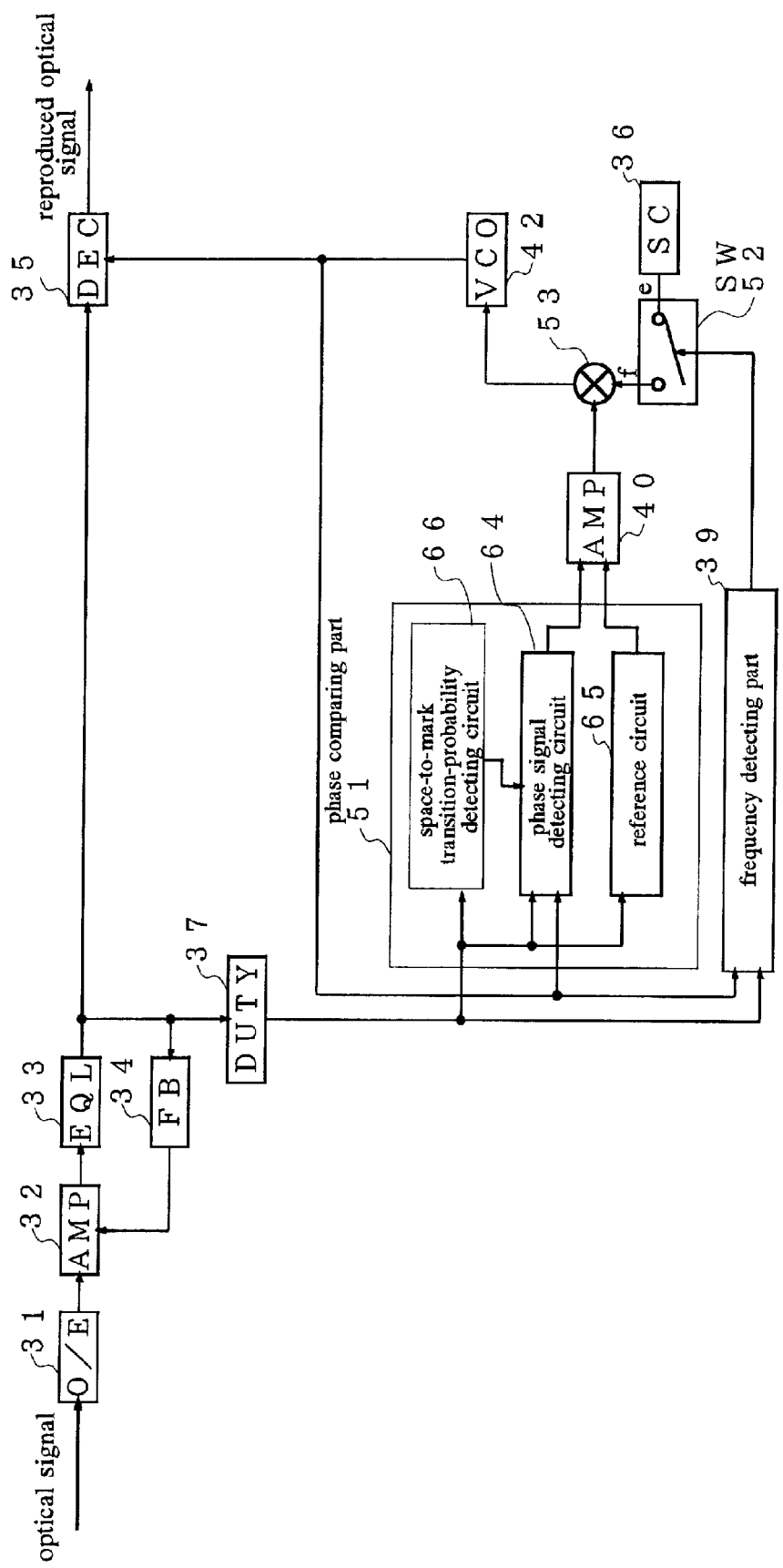
FIG. 10 is a block diagram of an optical receiving part according to a second embodiment.

As shown in FIG. 10, the received optical signal is received in an O/E 31, and converted from the optical signal to an electric signal.

The converted signal is inputted to an EQL 33 through an AMP 32 as a pre-amplifier. The inputted signal is equalized and amplified in the EQL 33, and inputted to an FB 34, a DEC 35, and a DUTY 37.

The FB 34 feeds back an output of the EQL 33 to the AMP 32, and the DEC 35 reproduces the signal from the EQL 33. The DUTY 37 reshapes the signal from the EQL 33 so that pulse widths of a mark and a space are almost equal to each other. An output of the DUTY 37 is inputted to a phase comparing part 51 and a frequency detecting part 39.

Meanwhile, an output of a VCO 42 is also inputted to the phase comparing part 51 and the frequency detecting part 39.

The frequency detecting part 39 detects a frequency difference between the output of the DUTY 37 and the output of the VCO 42, and outputs an output based on the frequency difference to an SW 52.

The phase comparing part 51 is structured by including a phase signal detecting circuit 64, a reference circuit 65, and a space-to-mark transition-probability detecting circuit 66. The output of the DUTY 37 which is inputted to the phase comparing part 51 is inputted to the phase signal detecting circuit 64, the reference circuit 65, and the space-to-mark transition-probability detecting circuit 66. Further, the output of the VCO 42 which is inputted to the phase comparing part 51 is inputted to the phase signal detecting circuit 64 and the reference circuit 65.

The space-to-mark transition-probability detecting circuit 66 detects a space-to-mark transition-probability of the electric signal (the optical signal received in the O/E 31) based on the output of the DUTY 37, and outputs an output based on the detecting result to the reference circuit 65.

The phase signal detecting circuit 64 outputs a voltage, which is based on a phase difference between the outputs of the DUTY 37 and VCO 42 and is further adjusted according to the output of the space-to-mark transition-probability detecting circuit 66, to an AMP 40.

The reference circuit 65 outputs a constant voltage to the AMP 40, irrespective of the phase difference between the outputs of the DUTY 37 and VCO 42.

The AMP 40 outputs a voltage based on a difference between the output voltages of the phase signal detecting circuit 64 and the reference circuit 65 to a mixer 53.

Therefore, the phase comparing part 51 detects the phase difference between the output of the DUTY 37 and the output of the VCO 42, and outputs the output based on the phase difference to the mixer 53.

The SW 52 is a 2-terminal switch whose connection state is controlled by an output of the frequency detecting part 39. A terminal e of the SW 52 is connected to an output terminal of an SC 36, and a terminal f of the SW 52 is connected to the mixer 53.

When the terminal e and the terminal f are connected in the SW 52, the mixer 53 superimposes a low-frequency voltage of the SC 36 on the output of the phase comparing part 51, and supplies the output to a control voltage terminal of the VCO 42. Meanwhile, when the terminal e and the terminal f are not connected in the SW 52, the mixer 53 supplies the output of the phase comparing part 51 to the control voltage terminal of the VCO 42.

(Operation and Effect of Second Embodiment)

Next, the operation and effect of the optical receiving part as above will be explained.

When the optical repeating apparatuses 23 and the optical receiving apparatus 24 which include the optical receiving part are installed in the optical communication system, the phase of a timing clock is set with reference to an eye pattern of the received optical signal. Then, an output value of the space-to-mark transition-probability detecting circuit 66 is set based on the set phase.

When the optical receiving part receives the optical signal, the frequency detecting part 39 detects the difference between the frequency of the electric signal based on the received optical signal and the oscillation frequency of the VCO 42. When the difference of the detecting result exceeds a predetermined range, the frequency detecting part 39 outputs a control signal which corresponds to this case to the SW 52, and controls the SW 52 to connect the terminal e and the terminal f. Meanwhile, when the difference of the detecting result does not exceed the predetermined range, the frequency detecting part 39 outputs a control signal which corresponds to this case to, the SW 52, and controls the SW 52 to disconnect the connection between the terminal e and the terminal f.

When the frequency detecting part 39 determines that the difference exceeds the predetermined range and the terminal e and the terminal f of the SW 52 are connected, the low-frequency voltage outputted from the SC 36 is superimposed on the output of the phase comparing part 51 to be outputted to the control voltage terminal of the VCO 42. Due to this low-frequency voltage, the oscillation frequency of the VCO 42 changes in a range exceeding the frequency pull-in range which is peculiar to a PLL circuit, and the oscillation frequency of the VCO 42 becomes the frequency within the predetermined range at some point in time.

When the frequency becomes within the predetermined range, the SW 52 is controlled by the control signal of the frequency detecting part 39 to disconnect the terminal e and the terminal f. Since the VCO 42 is oscillating within the frequency pull-in range which is peculiar to the PLL circuit, the output of the VCO 42 is locked so as to oscillate at the phase of the timing clock which is initially set.

Thus, the frequency detecting part 39, the SC 36 and the SW 52 permit the frequency pull-in range of the VCO 42 to increase exceeding the frequency pull-in range, which is peculiar to the PLL circuit. The increased frequency pull-in range is determined by a voltage amplitude of the SC 36, and the voltage amplitude is designed according to expected operating environments of the optical receiving part. Hence, the VCO 42 can be securely locked irrespective of change of environments such as working temperature.

Meanwhile, the phase comparing part 51 adjusts the output of the phase signal detecting circuit 64 according to the space-to-mark transition-probability detected by the space-to-mark transition-probability detecting circuit 66 so that the (expression 1) is satisfied. Hence, as explained in the first embodiment, even when the phase of the timing clock is set other than at 0, cross points between the outputs of the reference circuit 65 and the outputs of the phase signal detecting circuit 64 with respect to the phase are at the set phase difference, irrespective of the fluctuation of the space-to-mark transition-probability. As a result, the discrimination point is fixed irrespective of the fluctuation of the space-to-mark transition-probability, and therefore, it is possible to lower the error rate.

Next, an explanation about a third embodiment will be given.

(Structure of Third Embodiment)

The third embodiment is the embodiment of an optical communication system to which the present invention is applied.

The optical communication system according to the third embodiment is structured by including an optical sending apparatus 21 for sending an optical signal, an optical transmission line 22 for transmitting the sent optical signal, an optical receiving apparatus 24 for receiving the transmitted optical signal, and optical repeating apparatuses 23 being placed in the optical transmission line 22.

Since these are the same as those of the optical communication system according to the first embodiment, explanation thereof will be omitted. Further, the structure of an optical receiving part which is provided in the optical repeating apparatuses 23 and the optical receiving apparatus 24 is the same, except that a phase comparing part 56 is used instead of the phase comparing part 38, and hence its explanation will be omitted.

Next, an explanation about the phase comparing part 56 will be given.

Figure 11:
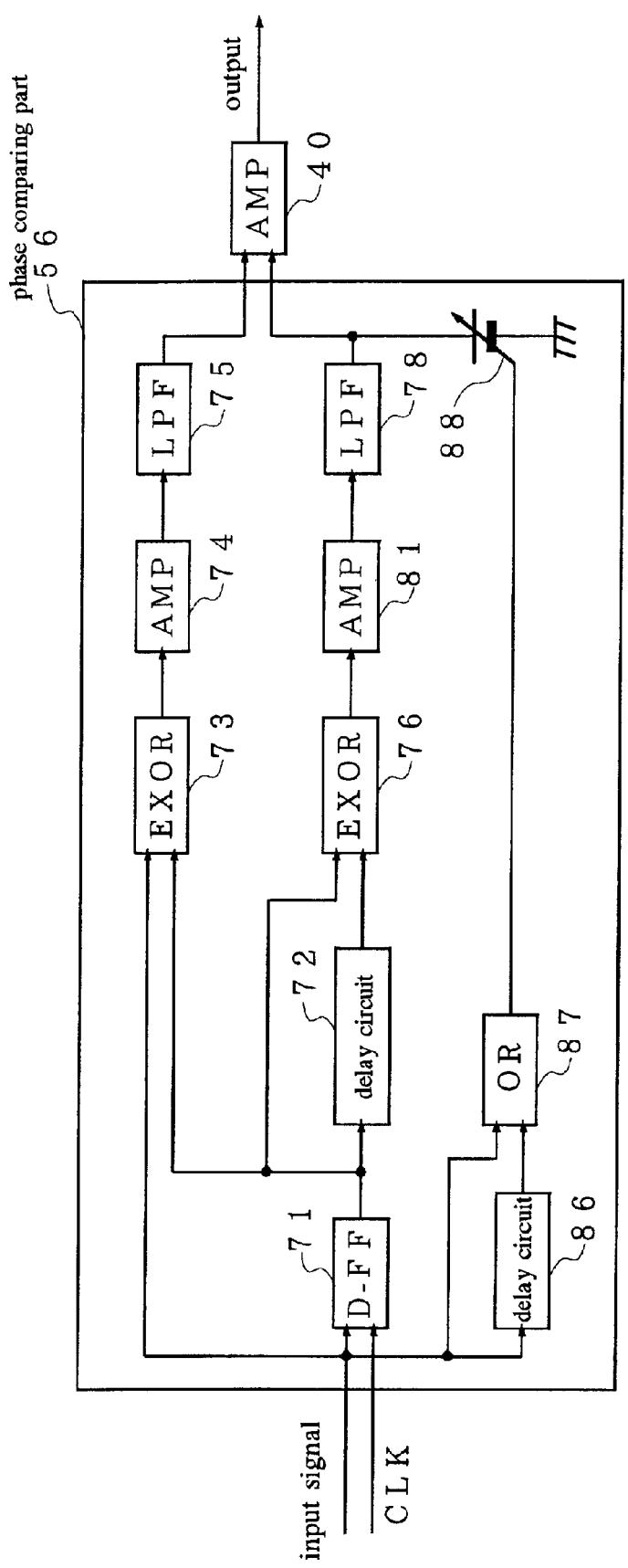
FIG. 11 is a block diagram of a phase comparing part according to a third embodiment.

As shown in FIG. 11, an output of a DUTY 37 (FIG. 2) is inputted to a D-FF 71, an EXOR 73, a delay circuit 86, and an OR circuit (hereinafter abbreviated to "OR") 87, respectively. Further, an output of a VCO 42 (FIG. 2) is inputted to a clock input of the D-FF 71.

The delay circuit 86 delays the input by a half cycle and outputs it to the OR 87. The OR 87 obtains an OR of the output of the DUTY 37 and the output of the delay circuit 86, and outputs the result to a control terminal of a variable voltage source 88 for controlling an output voltage.

An output of the D-FF 71 is inputted to a delay circuit 72, the EXOR 73, and an EXOR 76, respectively. The delay circuit 72 delays the input by a half cycle and outputs it to the EXOR 76. An output of the EXOR 76 is amplified in an AMP 81 and outputted to an LPF 78. An output of the LPF 78 is added with the output voltage of the variable voltage source 88 and inputted to an AMP 40 as an output of the phase comparing part. An output of the EXOR 73 is amplified in an AMP 74 and outputted to an LPF 75. Awn output of the LPF 75 is inputted to the AMP 40 as an output of the phase comparing part.

A phase signal detecting circuit consists of the EXOR 73, the AMP 74, and the LPF 75, and a reference circuit consists of the delay circuit 72, the EXOR 76, the AMP 81, and the LPF 78.

Further, a space-to-mark transition-probability detecting circuit consists of the delay circuit 86 and the OR 87. Hence, the output of the OR 87 is the signal corresponding to the space-to-mark transition-probability, and the output voltage value of the variable voltage source 88 is controlled according to the space-to-mark transition-probability.

(Operation and Effect of Third Embodiment)

According to the first and the second embodiments, the pulse waveform in the phase signal detecting circuit and the reference circuit is adjusted. However, according to the third embodiment, the output of the reference circuit is adjusted by the variable voltage source 88, thereby controlling the phase of the timing clock.

In the above-described phase comparing part 56, the pulse is averaged to be a direct current voltage in the LPF 78 of the reference circuit and outputted therefrom. Therefore, the output of the LPF 78 depends on a pulse amplitude, a time width and the space-to-mark transition-probability.

Supposing that the output of the reference circuit is supplied to the AMP 40 as it is, the phase of the timing clock fluctuates according to the space-to-mark transition-probability when the phase of the timing clock is set other than at 0, as explained in the first embodiment with reference to FIG. 4(c).

However, in the phase comparing part 56 according to the third embodiment, the output of the reference circuit (the output of the LPF 78) is added with the voltage corresponding to the space-to-mark transition-probability by the variable voltage source 88. For this reason, the phase comparing part 56 can input the output of the reference circuit to the AMP 40 so as to satisfy the (expression 1).

As a result, the set phase of the timing clock is kept almost fixed no matter how the phase of the timing clock is set, irrespective of the fluctuation of the probability for the space-to-mark transition. Hence, the discrimination point is fixed irrespective of the fluctuation of the probability for the space-to-mark transition, and therefore, it is possible to lower the error rate.

Incidentally, the output of the reference circuit is adjusted by the variable voltage source 88 according to the third embodiment, but it is suitable to adjust the output of the phase signal detecting circuit (the output of the LPF 75).

Next, an explanation about a fourth embodiment will be given.

(Structure of Fourth Embodiment)

The fourth embodiment is the embodiment of an optical communication system to which the present invention is applied.

The optical communication system according to the fourth embodiment is structured by including an optical sending apparatus 21 for sending an optical signal, an optical transmission line 22 for transmitting the sent optical signal, an optical receiving apparatus 24 for receiving the transmitted optical signal, and optical repeating apparatuses 23 being placed in the optical transmission line 22.

Since these are the same as those of the optical communication system according to the first embodiment, explanation thereof will be omitted. Hereinafter, the structure of an optical receiving part which is provided in the optical repeating apparatuses 23 and the optical receiving apparatus 24 will be explained.

Figure 12:
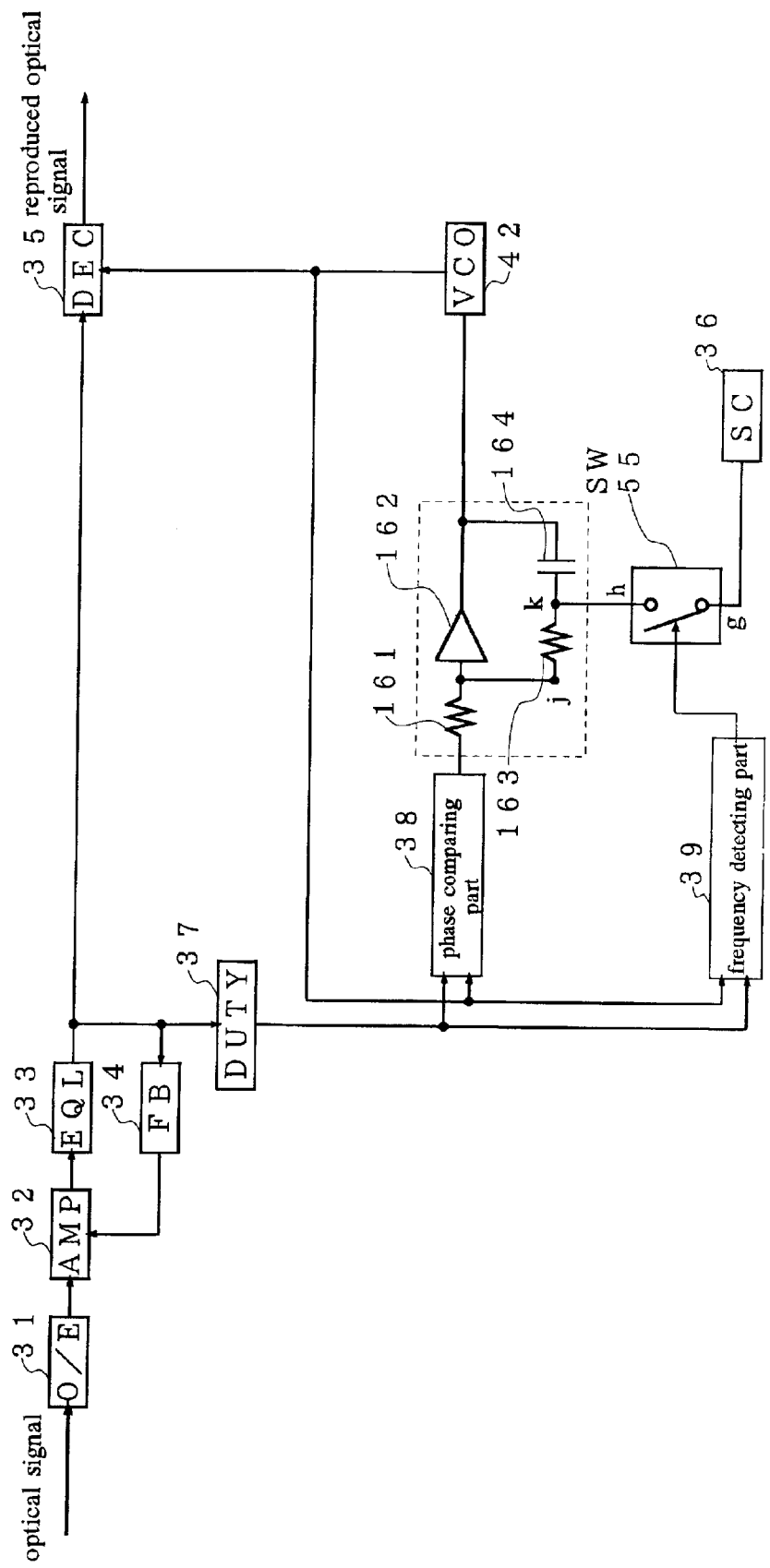
FIG. 12 is a block diagram of an optical receiving part according to a fourth embodiment.

As shown in FIG. 12, the received optical signal is received in an O/E 31, and converted from the optical signal to an electric signal. The converted signal is inputted to an EQL 33 through an AMP 32 as a pre-amplifier. The inputted signal is equalized and amplified in the EQL 33, and inputted to an FB 34, a DEC 35, and a DUTY 37.

The FB 34 feeds back an output of the EQL 33 to the AMP 32, and the DEC 35 reproduces the signal from the EQL 33. The DUTY 37 reshapes the electric signal from the EQL 33 so that pulse widths of a mark and a space are almost equal to each other. An output of the DUTY 37 is inputted to a phase comparing part 38 and a frequency detecting part 39.

Meanwhile, an output of a VCO 42 is also inputted to the phase comparing part 38 and the frequency detecting part 39. The frequency detecting part 39 detects a frequency difference between the output of the DUTY 37 and the output of the VCO 42, and outputs an output based on the frequency difference to a control terminal of an SW 55. The phase comparing part 38 detects a phase difference between the output of the DUTY 37 and the output of the VCO 42, and outputs an output based on the phase difference to an output terminal.

The output terminal of the phase comparing part 38 is connected to one end of a resistor 161. The other end of the resistor 161 is connected to an input terminal of an operational amplifier 162. An output terminal of the operational amplifier 162 is connected to a control voltage terminal of the VCO 42, and is connected to the input terminal of the operational amplifier 162 through a condenser 164 and a resistor 163 which are connected in series so that its output is fed back. Here, the resistors 161 and 163, the condenser 164, and the operational amplifier 162 form an integrator circuit.

The SW 55 is a 2-terminal switch whose connection state is controlled by the output of the frequency detecting part 39. A terminal g of the SW 55 is connected to an output terminal of an SC 36, and a terminal h of the SW 55 is connected to a contact k between the condenser 164 and the resistor 163.

(Operation and Effect of Fourth Embodiment)

Next, the operation and effect of the optical receiving part as described above will be explained.

Incidentally, an explanation about a discrimination point being kept fixed irrespective of fluctuation of a space-to-mark transition-probability, even when a phase of a timing clock is set other than at 0, is omitted because it is the same as that of the first embodiment.

When the optical receiving part receives the optical signal, the frequency detecting part 39 detects the difference between the frequency of the electric signal based on the received optical signal and the oscillation frequency of the VCO 42. When the difference of the detecting result exceeds a predetermined range, the frequency detecting part 39 outputs a control signal which corresponds to this case to the SW 55, and controls the SW 55 to connect the terminal g and the terminal h. Meanwhile, when the difference of the detecting result does not exceed the predetermined range, the frequency detecting part 39 outputs a control signal which corresponds to this case to the SW 55, and controls the SW 55 to disconnect the connection between the terminal g and the terminal h.

When the frequency detecting part 39 determines that the difference exceeds the predetermined range and the terminal g and the terminal h of the SW 55 are connected, a low-frequency voltage outputted from the SC 36 is superimposed on the output of the phase comparing part 38 in the integrator circuit to be outputted to the control voltage terminal of the VCO 42. Due to this low-frequency voltage, the oscillation frequency of the VCO 42 changes in a range exceeding the frequency pull-in range which is peculiar to a PLL circuit, and the oscillation frequency of the VCO 42 becomes the frequency within the predetermined range at some point in time.

When the frequency becomes within the predetermined range, the SW 55 is controlled by the control signal of the frequency detecting part 39 to disconnect the terminal g and the terminal h. Since the VCO 42 is oscillating within the frequency pull-in range which is peculiar to the PLL circuit, the output of the VCO 42 is locked so as to oscillate at the phase of the timing clock which is initially set.

Thus, the frequency detecting part 39, the SC 36 and the SW 55 permit the frequency pull-in range of the VCO 42 to increase exceeding the frequency pull-in range, which is peculiar to the PLL circuit. Hence, the VCO 42 can be securely locked irrespective of change of environments such as working temperature.

Incidentally, the terminal h of the SW 55 is connected to the contact k according to the fourth embodiment, but it may be connected to a contact j at which the resistor 163 is connected to the input terminal of the operational amplifier 162. By being thus connected, it is possible to operate as above.

Moreover, in the fourth embodiment, it is suitable to insert a resistor between the terminal h of the SW 55 and the contact k. By being thus structured, it is possible to prevent resonance between a parasitic capacitance of the SW 55 and an inductance generated in wiring.

Figure 14:
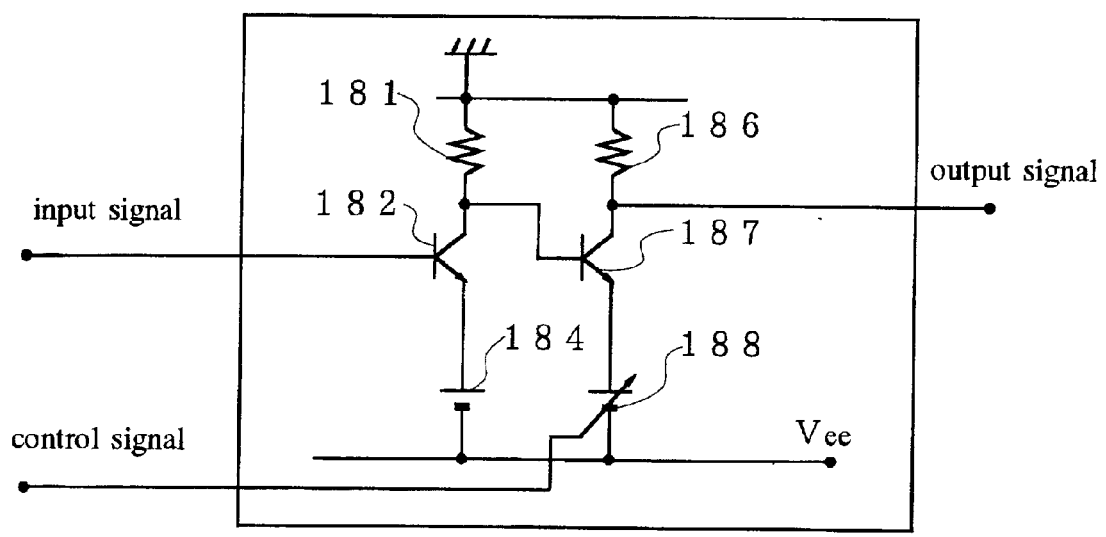
FIG. 14 is a circuit diagram showing the structure of another variable amplifier.
Figure 15:
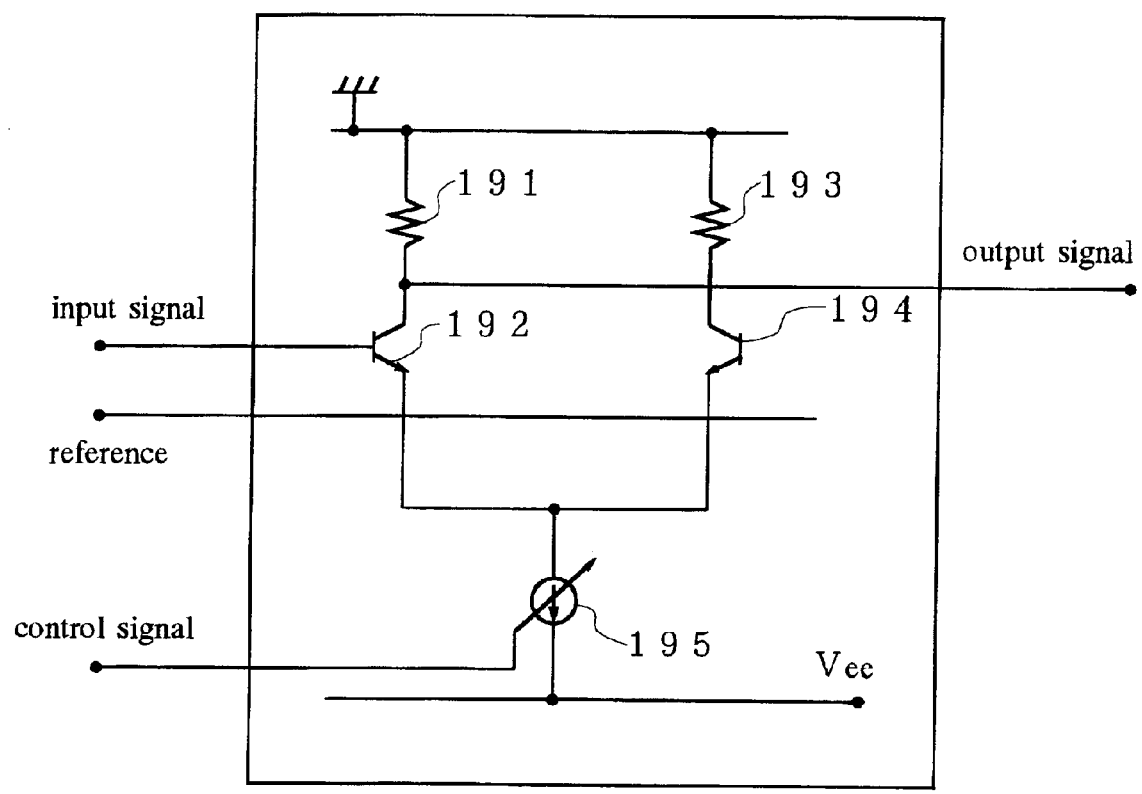
FIG. 15 is a circuit diagram showing the structure of another variable amplifier.
Figure 16:
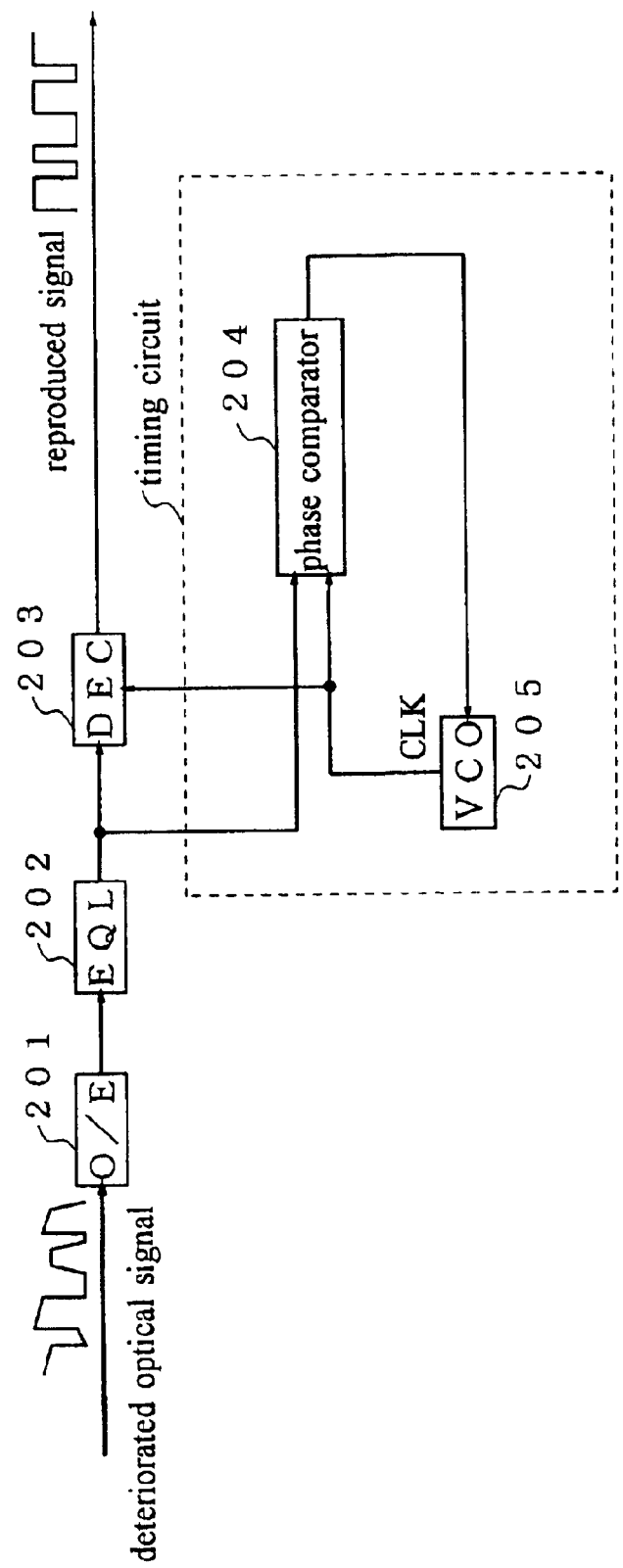
FIG. 16 is a block diagram showing a conventional optical receiving apparatus.
Figure 17:
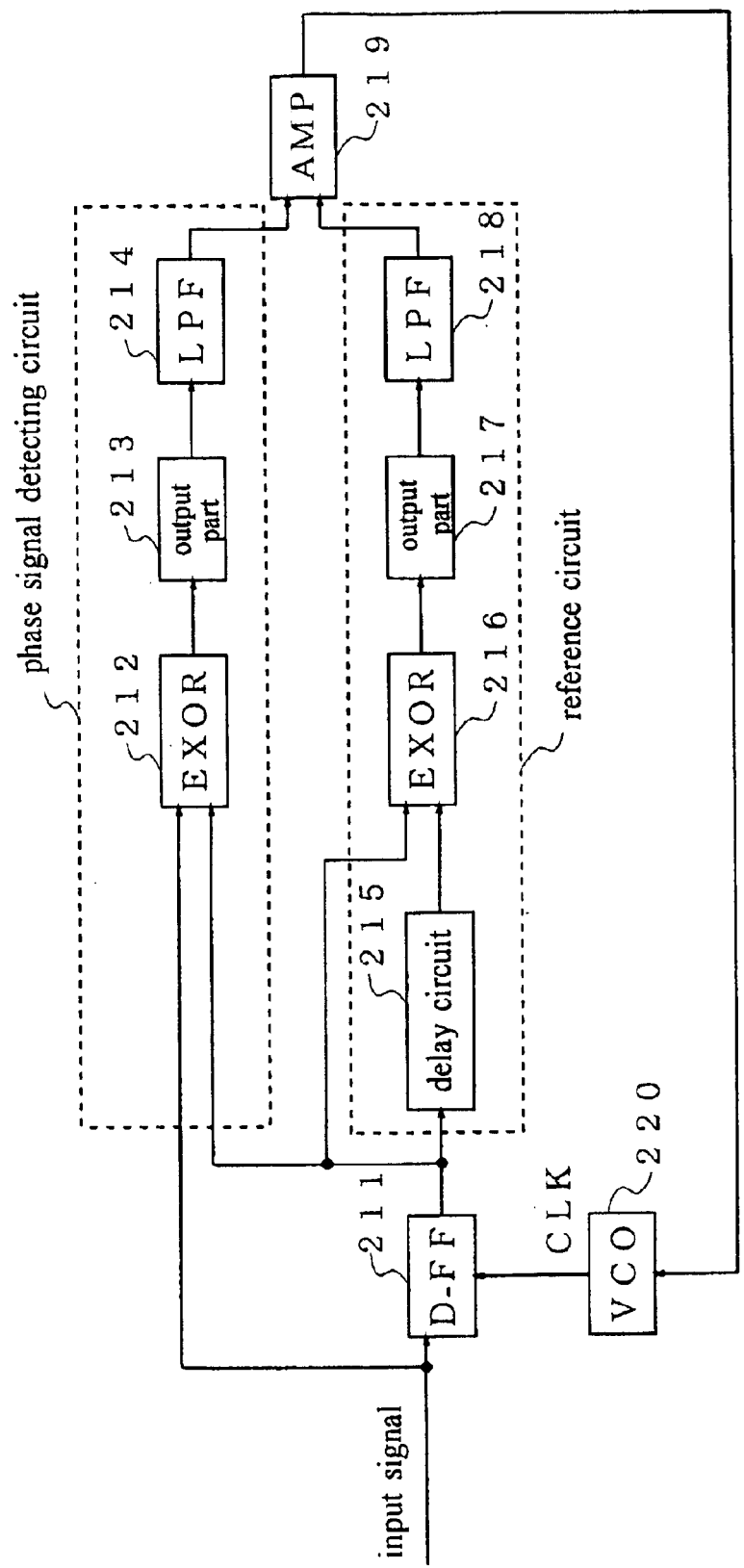
FIG. 17 is a block diagram showing a conventional timing circuit.
Figure 18A:
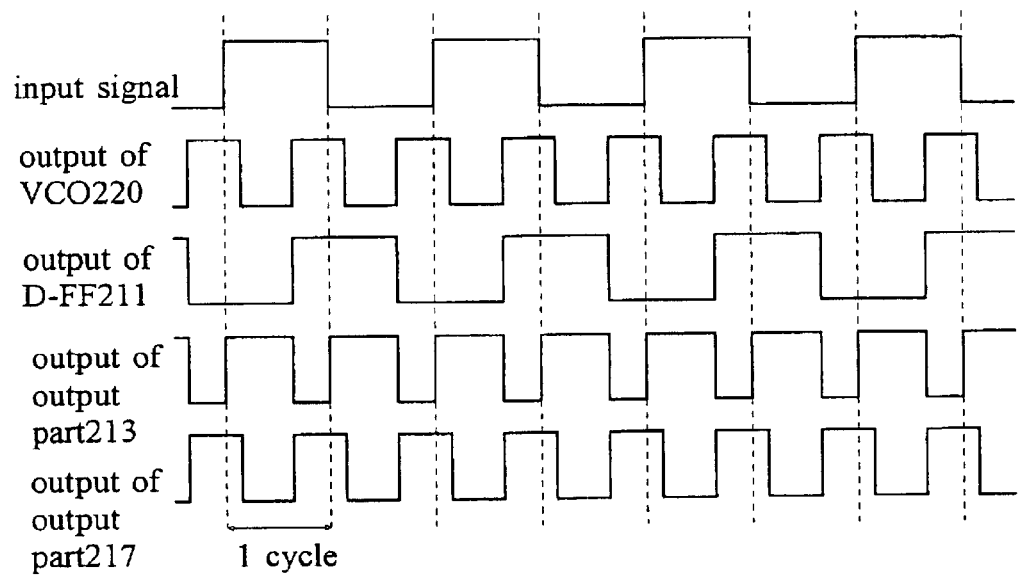
FIGS. 18(a) and 18(b) are time charts of the timing circuit shown in FIG. 17.
Figure 18B:
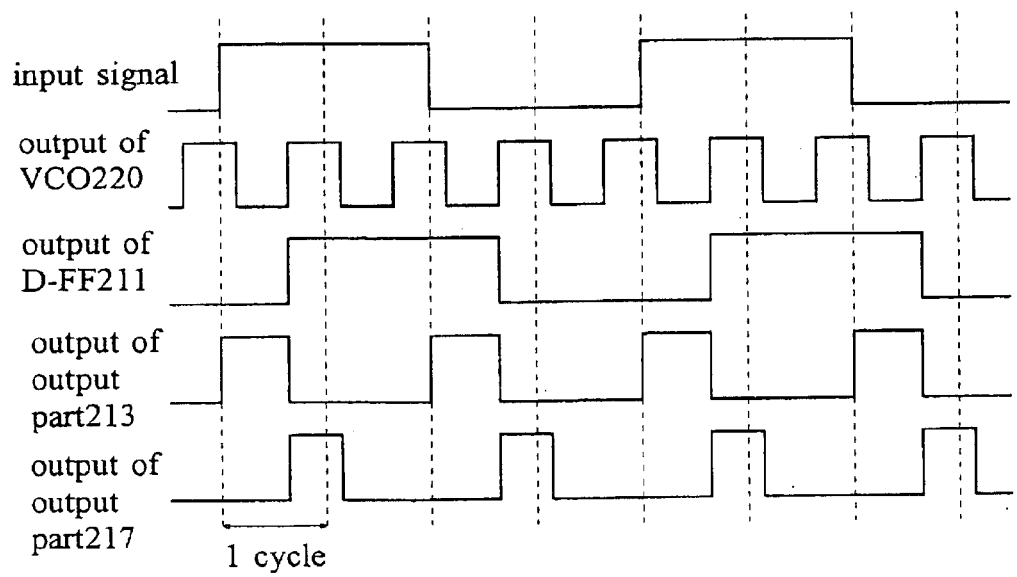

Incidentally, in the first embodiment, the circuit of the variable amplifier 77 is not limited to the circuit, which is shown in FIG. 6. An amplifier, which can vary the gain by a control signal from the exterior, can be used as the variable amplifier. For example, three other circuit examples of the variable amplifier are shown in FIG. 13, FIG. 14, and FIG. 15.

Figure 13:
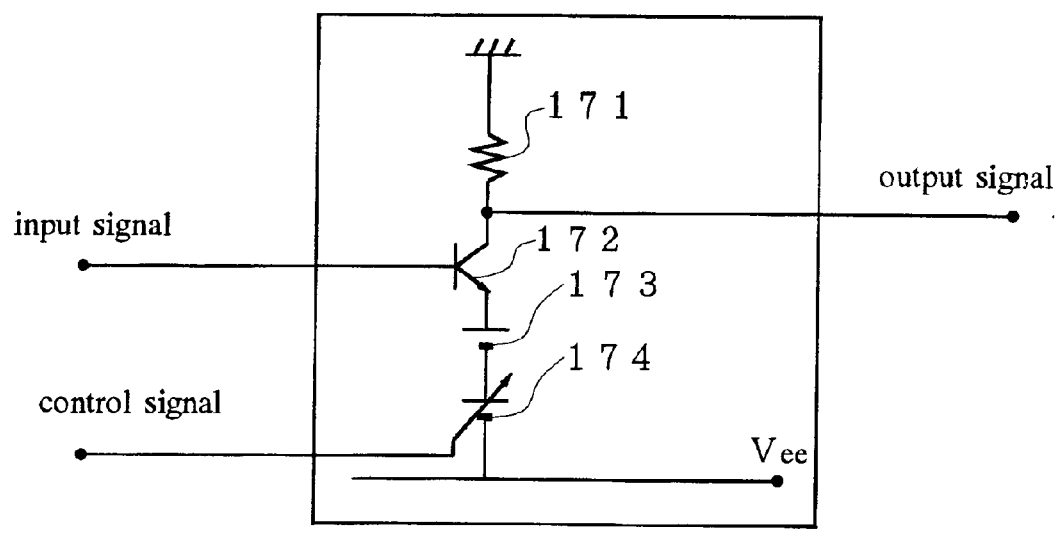
FIG. 13 is a circuit diagram showing the structure of another variable amplifier.

In FIG. 13, the variable amplifier is structured by a resistor 171, a transistor 172, a voltage source 173, and a variable voltage source 174. An input signal is inputted to a base terminal of the transistor 172, and a control signal is inputted to a control terminal of the variable voltage source 173. A collector terminal of the transistor 172 is grounded through the resistor 171. An emitter terminal of the transistor 172 is connected to the power source Vee through the voltage source 173 and the variable voltage source 174, which are connected in series. An output signal is taken out as a voltage between both ends of the resistor 171.

According to the variable amplifier as such, since the voltage of the variable voltage source 174 can be controlled by the control signal, the bias can be changed accordingly. Moreover, since the variable amplifier is provided with the fixed voltage source 173, it is possible to change the bias while keeping a fixed bias.

Hence, the output of the EXOR 76 is supplied as the input signal and the control signal, and the output signal is outputted to the LPF 68, whereby this variable amplifier can be used as the variable amplifier 77 shown in FIG. 6.

Further, in FIG. 14, the variable amplifier is structured by resistors 181 and 186, transistors 182 and 187, a voltage source 183, and a variable voltage source 188. An input signal is inputted to a base terminal of the transistor 182, and a control signal is inputted to a control terminal of the variable voltage source 188. A collector terminal of the transistor 182 is grounded through the resistor 181 and is connected to a base terminal of the transistor 187. An emitter terminal of the transistor 182 is connected to the power source Vee through the voltage source 183. A collector terminal of the transistor 187 is grounded through the resistor 186. An emitter terminal of the transistor 187 is connected to the power source Vee through the variable voltage source 188. An output signal is taken out as a voltage between both ends of the resistor 186.

According to the variable amplifier as such, since the voltage of the variable voltage source 188 can be controlled by the control signal, the bias can be changed accordingly. Further, since the two transistors 182 and 187 are connected in cascade, it is possible to obtain a large gain.

Hence, the output of the EXOR 76 is supplied as the input signal and the control signal, and the output signal is outputted to the LPF 68, whereby this variable amplifier can be used as the variable amplifier 77 shown in FIG. 6.

Furthermore, in FIG. 15, the variable amplifier is structured by resistors 191 and 193, transistors 192 and 194, and a variable current source 195. An input signal is inputted to a base terminal of the transistor 192, an inverting input of the input signal is inputted to a base terminal of the transistor 194, and a control signal is inputted to a control terminal of the variable current source 195.

A collector terminal of the transistor 192 is grounded through the resistor 191, and a collector terminal of the transistor 194 is grounded through the resistor 193. Emitter terminals of the transistor 192 and the transistor 194 are connected to each other, and its contact is connected to the power source Vee through the variable current source 195.

According to the variable amplifier as such, since the current of the variable current source 195 can be controlled by the control signal, the bias can be changed accordingly.

Hence, the output of the EXOR 76 is supplied as the input signal and the control signal, and the output signal is outputted to the LPF 68, whereby this variable amplifier can be used as the variable amplifier 77 shown in FIG. 6.

Incidentally, it is possible to use a reference signal instead of the inverting input of the input signal.

According to the first and the second embodiments, the low-frequency signal, which sweeps the oscillation frequency of the VCO, is directly supplied from the SC 36 to the control terminal of the VCO 42. However, the low-frequency signal may be supplied to the input side of the AMP 40 so that it is supplied to the control terminal of the VCO 42 through the AMP 40. When it is supplied through the AMP 40, the amplitude of the low-frequency signal is limited by a saturation gain of the AMP 40, and hence breakage of the VCO 42 can be prevented. Thus, in supplying the low-frequency signal, a circuit such as an amplifier, a low-pass filter or the like may be inserted between the output terminal of the SC 36 and the control terminal of the VCO 42, as long as the oscillation frequency of the VCO can be swept by the low-frequency signal of the SC 36.

Although the space-to-mark transition-probability detecting circuit consists of the delay circuit 72 and the EXOR 76 in FIG. 6, the delay circuit 83 and the AND 84 in FIG. 8, and the delay circuit 86 and the OR 87 in FIG. 11, these can be replaced with one another among the respective drawings.

Additionally, in the optical communication system according to the first to the fourth embodiments, it is suitable that the optical repeating apparatus 23 is further provided with an ADM (add/drop multiplexing) function by which an optical signal is added/dropped to/from a wavelength-division multiplexing signal transmitting through the optical transmission line.

The invention is not limited to the above embodiments and various modifications may be made without departing from the spirit and scope of the invention. Any improvement may be made in part or all of the components.

What is claimed is:

1. A phase lock loop circuit, comprising:
   a space-to-mark transition probability detecting unit detecting a space-to-mark transition-probability of an input signal by using only the input signal, wherein the input signal is a pulse; and
   an adjusting unit adjusting an output of a phase comparator according to the space-to-mark transition-probability detected by said space-to-mark transition-probability detecting unit so that an output of a voltage controlled oscillator has a predetermined frequency and phase, wherein the phase comparator comprises:
      a phase signal detecting unit for output according to a phase difference between the input signal and the output of the voltage controlled oscillator, and
      a reference unit for outputting a reference signal of a fixed value according to the input signal; and
   said adjusting unit adjusts an output pulse of the phase signal detecting unit and an output pulse of the reference unit according to the space-to-mark transition-probability detected by said space-to-mark transition-probability detecting unit so that a product of an amplitude and a time of the output pulse of the phase signal detecting unit and a product of an amplitude and a time of the output pulse of the reference unit are equal to each other.

2. The phase lock loop circuit according to claim 1, wherein:
   said adjusting unit adjusts an amplitude of the pulse.

3. The phase lock loop circuit according to claim 1, wherein:
   said adjusting unit adjusts a time width of the pulse.

4. The phase lock loop circuit according to claim 1, wherein
   the phase comparator further comprises a circuit, symmetrical to said adjusting unit, maintaining symmetry of respective circuits of the phase signal detecting unit and the reference unit.

5. An optical repeating apparatus, comprising:
   a phase lock loop circuit, comprising:
      a space-to-mark transition-probability detecting unit detecting a space-to-mark transition-probability of an input signal, wherein the input signal is a pulse; and
      an adjusting unit adjusting an output of a phase comparator according to the space-to-mark transition-probability detected by the space-to-mark transition-probability detecting unit so that an output of a voltage controlled oscillator has a predetermined frequency and phase, wherein the phase comparator comprises:
         a phase signal detecting unit for outputting according to a phase difference between the input signal and the output of the voltage controlled oscillator, and
         a reference for outputting a reference signal of a fixed value according to the input signal; and
      said adjusting unit adjusts an output pulse of the phase signal detecting unit and an output pulse of the reference unit according to the space-to-mark transition-probability detected by said space-to-mark transition-probability detecting unit so that a product of an amplitude and a time of the output pulse of the phase signal detecting unit and a product of an amplitude and a time of the output pulse of the reference unit are equal to each other.

6. The optical repeating apparatus according to claim 5, wherein:
   said adjusting unit adjusts an amplitude of the pulse.

7. The optical repeating apparatus according to claim 5, wherein:
   said adjusting unit adjusts a time width of the pulse.

8. The optical repeating apparatus according to claim 5, wherein
   the phase comparator further includes a circuit being symmetrical to said adjusting unit so as to keep symmetry of circuits of the phase signal detecting unit and the reference unit.

9. An optical repeating apparatus, comprising:
   a phase lock loop circuit, comprising:
      a space-to-mark transition-probability detecting unit detecting a space-to-mark transition-probability of an output signal, and an adjusting unit adjusting an output of a phase comparator according to the space-to-mark transition-probability detected by the space-to-mark transition-probability detecting unit so that an output of a voltage controlled oscillator has a predetermined frequency and phase;

a low-frequency supplying unit supplying a low-frequency alternating-current signal to a control terminal to control an oscillation frequency of the voltage controlled oscillator;

a frequency detecting unit detecting a frequency difference between the input signal and the output of the voltage controlled oscillator; and a unit suspending supply of the low-frequency alternating-current signal according to an output of the frequency detecting unit.

10. An optical terminal apparatus, comprising:
a phase lock loop circuit, comprising:
   a space-to-mark transition-probability detecting unit detecting a space-to-mark transition-probability of an input signal, wherein the input signal is a pulse, and
   an adjusting unit adjusting an output of a phase comparator according to the space-to-mark transition-probability detected by the space-to-mark transition-probability detecting unit so that an output of a voltage controlled oscillator has a predetermined frequency and phase, wherein the phase comparator comprises:
      a phase signal detecting unit for outputting according to a phase difference between the input signal and the output of the voltage controlled oscillator, and
      a reference unit for outputting a reference signal of a fixed value according to the input signal; and
   said adjusting units adjusts an output pulse of the phase signal detecting unit and an output pulse of the reference unit according to the space-to-mark transition-probability detected by said space-to-mark transition-probability detecting unit so that a product of an amplitude and a time of the output pulse of the phase signal detecting unit and a product of an amplitude and a time of the output pulse of the reference unit are equal to each other.

11. The optical terminal apparatus according to claim 10, wherein:
said adjusting unit adjusts an amplitude of the pulse.

12. The optical terminal apparatus according to claim 10, wherein:
said adjusting unit adjusts a time width of the pulse.

13. The optical terminal apparatus according to claim 10, wherein:
the phase comparator further includes a circuit being symmetrical to said adjusting unit so as to keep symmetry of circuits of the phase signal detecting unit and the reference unit.

14. The optical terminal apparatus according to claim 10, further comprising:
a low-frequency supplying unit for supplying a low-frequency signal to a control terminal for controlling an oscillation frequency of the voltage controlled oscillator.

15. An optical repeating apparatus, comprising:
an equalizing amplifier to which an input signal is inputted;
a time circuit to which an output of said equalizing amplifier is inputted, for extracting a timing clock from the input signal;

a discrimination decision circuit for discriminating and reproducing the signal from the output of said equalizing amplifier according to the timing clock, wherein said equalizing amplifier includes at least one of a low-pass filter and a high-frequency emphasis circuit for changing a gain at a boundary of a predetermined frequency, which are formed on a same semiconductor substrate; and said timing circuit includes:
   a space-to-mark transition-probability detecting unit for detecting space-to-mark transition-probability of the input signal, and
   an adjusting unit for adjusting an output of a phase comparator according to the space-to-mark transition-probability detected by the space-to-mark transition-probability detecting unit so that an output of a voltage controlled oscillator has a predetermined frequency and phase.

16. The optical repeating apparatus according to claim 15, wherein:
the input signal is a pulse; and
said adjusting unit adjusts an amplitude of the pulse.

17. The optical repeating apparatus according to claim 16, wherein:
the high-frequency emphasis circuit is the circuit in which a resistor and a condenser being connected in parallel are connected as a load resistance of an emitter ground transistor.

18. The optical repeating apparatus according to claim 15, wherein:
the input signal is a pulse; and
said adjusting unit adjusts a time width of the pulse.

19. The optical repeating apparatus according to claim 18, wherein:
the high-frequency emphasis circuit is the circuit in which a resistor and a condenser being connected in parallel are connected as a load resistance of an emitter ground transistor.

20. The optical repeating apparatus according to claim 15, wherein:
the input signal is a pulse;
the phase comparator includes:
   a phase signal detecting unit for outputting according to a phase difference between the input signal and the output of the voltage controlled oscillator; and
   a reference unit for outputting a reference signal of a fixed value according to the input signal; and
said adjusting unit adjusts an output pulse of the phase signal detecting unit and an output pulse of the reference unit according to the space-to-mark transition-probability detected by said space-to-mark transition-probability detecting unit so that a product of an amplitude and a time of the output pulse of the phase signal detecting unit and a product of an amplitude and a time of the output pulse of the reference unit are equal to each other.

21. The optical repeating apparatus according to claim 20, wherein
the phase comparator further includes a circuit being symmetrical to said adjusting unit so as to keep symmetry of circuits of the phase signal detecting unit and the reference unit.

22. The optical repeating apparatus according to claim 21, wherein:
the high-frequency emphasis circuit is the circuit in which a resistor and a condenser being connected in parallel are connected as a load resistance of an emitter ground transistor.

23. The optical repeating apparatus according to claim 20, wherein:
the high-frequency emphasis circuit is the circuit in which a resistor and a condenser being connected in parallel are connected as a load resistance of an emitter ground transistor.

24. The optical repeating apparatus according to claim 15, further comprising:
a low-frequency supplying unit for supplying a low-frequency signal to a control terminal for controlling an oscillation frequency of the voltage controlled oscillator.

25. The optical repeating apparatus according to claim 24, wherein:
the high-frequency emphasis circuit is the circuit in which a resistor and a condenser being connected in parallel are connected as a load resistance of an emitter ground transistor.

26. The optical repeating apparatus according to claim 15, wherein:
the high-frequency emphasis circuit is the circuit in which a resistor and a condenser being connected in parallel are connected as a load resistance of an emitter ground transistor.

27. An optical terminal apparatus comprising:
an equalizing amplifier to which an input signal is inputted;
a timing circuit to which an output of said equalizing amplifier is inputted, for extracting a timing clock from the input signal;
a discrimination decision circuit for discriminating and reproducing the input signal from the output of said equalizing amplifier according to the timing clock, wherein said equalizing amplifier includes at least one of a low-pass filter and a high-frequency emphasis circuit for changing a gain at a boundary of a predetermined frequency, which are formed on a same semiconductor substrate; and
said timing circuit includes:
a space-to-mark transition-probability detecting unit for detecting a space-to-mark transition-probability of the input signal, and
an adjusting unit for adjusting an output of a phase comparator according to the space-to-mark transition-probability detected by the space-to-mark transition-probability detecting unit so that an output of a voltage controlled oscillator has a predetermined frequency and phase.

28. The optical terminal apparatus according to claim 27, wherein:
the input signal is a pulse; and
said adjusting unit adjusts an amplitude of the pulse.

29. The optical terminal apparatus according to claim 28, wherein:
the high-frequency emphasis circuit is the circuit in which a resistor and a condenser being connected in parallel are connected as a load resistance of an emitter ground transistor.

30. The optical terminal apparatus according to claim 27, wherein:
the input signal is a pulse; and
said adjusting unit adjusts a time width of the pulse.

31. The optical terminal apparatus according to claim 30, wherein:
the high-frequency emphasis circuit is the circuit in which a resistor and a condenser being connected in parallel are connected as a load resistance of an emitter ground transistor.

32. The optical terminal apparatus according to claim 27, wherein:
the input signal is a pulse;
the phase comparator includes:
a phase signal detecting unit for outputting according to a phase difference between the input signal and the output of the voltage controlled oscillator; and
a reference unit for outputting a reference signal of a fixed value according to the input signal; and
said adjusting unit adjusts an output pulse of the phase signal detecting unit and an output pulse of the reference unit according to the space-to-mark transition-probability detected by said space-to-mark transition-probability detecting unit so that a product of an amplitude and a time of the input pulse of the phase signal detecting unit and a product of an amplitude and a time of the output pulse of the reference unit are equal to each other.

33. The optical terminal apparatus according to claim 32, wherein:
the phase comparator further includes a circuit being symmetrical to said adjusting unit so as to keep symmetry of circuits of the phase signal detecting unit and the reference unit.

34. The optical terminal apparatus according to claim 33, wherein
the high-frequency emphasis circuit is the circuit in which a resistor and a condenser being connected in parallel are connected as a load resistance of an emitter ground transistor.

35. The optical terminal apparatus according to claim 32, wherein
the high-frequency emphasis circuit is the circuit in which a resistor and a condenser being connected in parallel are connected as a load resistance of an emitter ground transistor.

36. The optical terminal apparatus according to claim 27, further comprising:
a low-frequency supplying unit for supplying a low-frequency signal to a control terminal for controlling an oscillation frequency of the voltage controlled oscillator.

37. The optical terminal apparatus according to claim 36, wherein
the high-frequency emphasis circuit is the circuit in which a resistor and a condenser being connected in parallel are connected as a load resistance of an emitter ground transistor.

38. The optical terminal apparatus according to claim 27, wherein:
the high-frequency emphasis circuit is the circuit in which a resistor and a condenser being connected in parallel are connected as a load resistance of an emitter ground transistor.

39. An optical communication system, comprising:
an optical repeating apparatus including a phase lock loop circuit, wherein the phase lock loop circuit comprises:
a space-to-mark transition-probability detecting unit detecting a space-to-mark transition-probability of an input signal, wherein the input signal is a pulse, and
an adjusting unit adjusting an output of a phase comparator according to the space-to-mark transition-probability detected by the space-to-mark transition-probability detecting unit so that an output of a voltage controlled oscillator has a predetermined frequency and phase, wherein the phase comparator comprises:
a phase signal detecting unit for outputting according to a phase difference between the input signal and the output of the voltage controlled oscillator, and
a reference unit for outputting a reference signal of a fixed value according to the input signal; and
said adjusting unit adjusts an output pulse of the phase signal detecting unit and an output pulse of the reference unit according to the space-to-mark transition-probability detected by said space-to-mark transition-probability detecting unit so that a product of an amplitude and a time of the output pulse of the phase signal detecting unit and a product of an amplitude and a time of the output pulse of the reference unit are equal to each other.

40. The optical communication system according to claim 39, wherein:
the input signal is a pulse; and
said adjusting unit adjusts an amplitude of the pulse.

41. The optical communication system according to claim 39, wherein:
the input signal is a pulse; and
said adjusting unit adjusts a time width of the pulse.

42. The optical communication system according to claim 39, wherein
the phase comparator further comprises a circuit, symmetrical to said adjusting unit, maintaining symmetry of respective circuits of the phase signal detecting unit and the reference unit.

43. An optical communication system, comprising:
an optical repeating apparatus including a phase lock loop circuit, wherein the phase lock loop circuit comprises:
a space-to-mark transition-probability detecting unit detecting a space-to-mark transition-probability of an input signal, and
an adjusting unit adjusting an output of a phase comparator according to the space-to-mark transition-probability detected by the space-to-mark transition-probability detecting unit so that an output of a voltage controlled oscillator has a predetermined frequency and phase;
a low-frequency supplying unit supplying a low-frequency alternating-current signal to a control terminal to control an oscillation frequency of the voltage controlled oscillator;
a frequency detecting unit detecting a frequency difference between the input signal and the output of the voltage controlled oscillator; and
a unit suspending supply of the low-frequency alternating-current signal according to an output of the frequency detecting unit.

44. An optical communication system comprising an optical repeating apparatus, which includes:
an equalizing amplifier to which an input signal is inputted;
a timing circuit to which an output of said equalizing amplifier inputted, for extracting a timing clock from the input signal; and
a discrimination decision circuit for discriminating and reproducing the input signal from the output of said equalizing amplifier according to the timing clock, wherein said equalizing amplifier includes at least one of a low-pass filter and a high-frequency emphasis circuit for changing a gain at a boundary of a predetermined frequency, which are formed on a same semiconductor substrate;
the timing circuit includes:
the space-to-mark transition-probability detecting unit for detecting a space-to-mark transition-probability of the input signal, and
an adjusting unit for adjusting an output of a phase comparator according to the space-to-mark transition-probability detected by the space-to-mark transition-probability detecting unit so that an output of a voltage controlled oscillator has a predetermined frequency and phase.

45. The optical communication system according to claim 44, wherein:
the input signal is a pulse; and
said adjusting unit adjusts an amplitude of the pulse.

46. The optical communication system according to claim 44, wherein:
the input signal is a pulse; and
said adjusting unit adjusts a time width of the pulse.

47. The optical communication system according to claim 44, wherein:
the input signal is a pulse;
the phase comparator includes:
a phase signal detecting unit for outputting according to a phase difference between the input signal and the output of the voltage controlled oscillator, and
a reference unit for outputting a reference signal of a fixed value according to the input signal; and
said adjusting unit adjusts an output pulse of the phase signal detecting unit and an output pulse of the reference unit according to the space-to-mark transition-probability detected by said space-to-mark transition-probability detecting unit so that a product of an amplitude and a time of the output pulse of the phase signal detecting unit and a product of an amplitude and a time of the output pulse of the reference unit are equal to each other.

48. The optical communication system according to claim 47, wherein
the phase comparator further includes a circuit being symmetrical to said adjusting unit so as to keep symmetry of circuits of the phase signal detecting unit and the reference unit.

49. The optical communication system according to claim 44, further comprising
a low-frequency supplying unit for supplying a low-frequency signal to a control terminal for controlling an oscillation frequency of the voltage controlled oscillator.

50. An optical communication system, comprising:
an optical terminal apparatus including a phase lock loop circuit, the phase lock loop circuit comprises:
a space-to-mark transition-probability detecting unit to detect a space-to-mark transition-probability of an input signal, wherein the input signal is a pulse;
an adjusting unit generating a signal used to adjust an output of a phase comparator according to the space-to-mark transition-probability detected by the space-to-mark transition-probability detecting unit so that an output of a voltage controlled oscillator has a predetermined frequency and phase, wherein the phase comparator further comprises:
a phase signal detecting unit for outputting according to a phase difference between the input signal and the output of the voltage controlled oscillator, and a reference unit for outputting a reference signal of a fixed value according to the input signal; and said adjusting unit adjusts an output pulse of the phase signal detecting unit and an output pulse of the reference unit according to the space-to-mark transition-probability detected by said space-to-mark transition-probability detecting unit so that a product of an amplitude and a time of the output pulse of the phase signal detecting unit and a product of an amplitude and a time of the output pulse of the reference unit are equal to each other.

51. The optical communication system according to claim 50, wherein:

said adjusting unit adjusts an amplitude of the pulse.

52. The optical communication system according to claim 50, wherein:

said adjusting unit adjusts a time width of the pulse.

53. The optical communication system according to claim 50, wherein:

the phase comparator further includes a circuit symmetrical to said adjusting unit, so as to maintain symmetry of respective circuits of the phase signal detecting unit and the reference unit.

54. An optical communication system, comprising:

an optical terminal apparatus including a phase lock loop circuit, wherein the phase lock loop circuit comprises:
 a space-to-mark transition-probability detecting unit to detect a space-to-mark transition-probability of an input signal, and
 an adjusting unit generating a signal used to adjust an output of a phase comparator according to the space-to-mark transition-probability detected by the space-to-mark transition-probability detecting unit so that an output of a voltage controlled oscillator has a predetermined frequency and phase;

a low-frequency supplying unit supplying a low-frequency alternating-current signal to a control terminal to control an oscillation frequency of the voltage controlled oscillator;

a frequency detecting unit detecting a frequency difference between the input signal and the output of the voltage controlled oscillator; and a unit suspending supply of the low-frequency alternating-current signal according to an output of the frequency detecting unit.

55. An optical communication system comprising an optical terminal apparatus, which includes:

an equalizing amplifier to which an input signal is inputted;

a timing circuit to which an output of said equalizing amplifier is inputted, for extracting a timing clock from the input signal;

a discrimination decision circuit for discriminating and reproducing the input signal from the output of said equalizing amplifier according to the timing clock, wherein said equalizing amplifier includes at least one of a low-pass filter and a high-frequency emphasis circuit for changing a gain at a boundary at a predetermined frequency, which are formed on a same semiconductor substrate; and the timing circuit includes:
 a space-to-mark transition-probability detecting unit for detecting a space-to-mark transition-probability of the input signal, and
 an adjusting unit for adjusting an output of a phase comparator according to the space-to-mark transition-probability detected by the space-to-mark transition-probability detecting unit so that an output of a voltage controlled oscillator has a predetermined frequency and phase.

56. The optical communication system according to claim 55, wherein:

the input signal is a pulse; and said adjusting unit adjusts an amplitude of the pulse.

57. The optical communication system according to claim 55, wherein:

the input signal is a pulse; and said adjusting unit adjusts a time width of the pulse.

58. The optical communication system according to claim 55, wherein:

the input signal is a pulse;

the phase comparator includes:
 a phase signal detecting unit for outputting according to a phase difference between the input signal and the output of the voltage controlled oscillator; and
 a reference unit for outputting a reference signal of a fixed value according to the input signal; and said adjusting unit adjusts an output pulse of the phase signal detecting unit and an output pulse of the reference unit according to the space-to-mark transition-probability detected by said space-to-mark transition-probability detecting unit so that a product of an amplitude and a time of the output pulse of the phase signal detecting unit and a product of an amplitude and a time of the output pulse of the reference unit are equal to each other.

59. The optical communication system according to claim 58, wherein:

the phase comparator further includes a circuit being symmetrical to said adjusting unit so as to keep symmetry of circuits of the phase signal detecting unit and the reference unit.

60. The optical communication system according to claim 55, further comprising:

a low-frequency supplying unit for supplying a low-frequency signal to a control terminal for controlling an oscillation frequency of the voltage controlled oscillator.

61. The optical communication system according to claim 55, wherein:

the high-frequency emphasis circuit is the circuit in which a resistor and a condenser being connected in parallel are connected as a load resistance of an emitter ground transistor.

* * * * *

UNITED STATES PATENT AND TRADEMARK OFFICE
CERTIFICATE OF CORRECTION

PATENT NO. : 7,027,741 B2
APPLICATION NO. : 10/128672
DATED : April 11, 2006
INVENTOR(S) : Masazumi Marutani et al.

It is certified that error appears in the above-identified patent and that said Letters Patent is hereby corrected as shown below:

First Page Column 1 (Inventors), Line 1, change "Kawaski" to --Kawasaki--.

Column 21, Line 55, change "transition probability" to --transition-probability--.

Column 21, Line 65, change "output" to --outputting--.

Column 22, Line 40, change "reference for" to --reference unit for--.

Column 22, Line 67, change "output" to --input--.

Column 23, Line 34, change "units" to --unit--.

Column 23, Line 65, change "time" to --timing--.

Column 24, Line 2, insert --input-- before "signal".

Column 24, Line 11, change "detecting" to --detecting a--.

Column 26, Line 16, change "input" to --output--.

Column 27, Line 61, change "amplifier" to --amplifier is--.

Column 28, Line 5, change "the" to --a--.

Column 28, Line 54, change "circuit," to --circuit, wherein--.

Column 29, Line 60, change "boundary at" to --boundary of--.

Signed and Sealed this

Twenty-eighth Day of September, 2010

David J. Kappos
*Director of the United States Patent and Trademark Office*